United States Patent
Kovac

(10) Patent No.: US 9,923,521 B1
(45) Date of Patent: Mar. 20, 2018

(54) STACKED PA POWER CONTROL

(71) Applicant: Peregrine Semiconductor Croporation, San Diego, CA (US)

(72) Inventor: David Kovac, Arlington Heights, IL (US)

(73) Assignee: pSemi Corporation, San Diego, CA (US)

(*) Notice: Subject to any disclaimer, the term of this patent is extended or adjusted under 35 U.S.C. 154(b) by 0 days.

(21) Appl. No.: 15/451,184

(22) Filed: Mar. 6, 2017

(51) Int. Cl.
*H03F 1/22* (2006.01)
*H03F 1/02* (2006.01)
*H03F 3/193* (2006.01)
*H03F 3/21* (2006.01)
*G05F 1/56* (2006.01)

(52) U.S. Cl.
CPC ............ *H03F 1/0222* (2013.01); *G05F 1/56* (2013.01); *H03F 1/223* (2013.01); *H03F 3/193* (2013.01); *H03F 3/21* (2013.01); *H03F 2200/18* (2013.01); *H03F 2200/375* (2013.01); *H03F 2200/451* (2013.01)

(58) Field of Classification Search
CPC ........................................................ H03F 1/22
USPC ................................................. 330/311, 310
See application file for complete search history.

(56) References Cited

U.S. PATENT DOCUMENTS

| 3,469,212 A | 9/1969 | Georg et al. |
| 4,079,336 A | 3/1978 | Gross |
| 4,241,316 A | 12/1980 | Knapp |
| 4,528,517 A | 7/1985 | Schlotzhauer |
| 4,651,409 A | 3/1987 | Ellsworth et al. |
| 5,012,123 A | 4/1991 | Ayasli et al. |

(Continued)

FOREIGN PATENT DOCUMENTS

| FR | 3005787 | 11/2014 |
| WO | 0148828 | 7/2001 |

(Continued)

OTHER PUBLICATIONS

Adamski, Jaroslaw, "LDO wtih Fast Recovery from Saturation", patent application filed in the USPTO on Jan. 25, 2017, U.S. Appl. No. 15/415,768, 41 pgs.

(Continued)

*Primary Examiner* — Henry Choe
(74) *Attorney, Agent, or Firm* — Jaquez Land Greenhaus LLP; Martin J. Jaquez, Esq.; Alessandro Steinf, Esq.

(57) ABSTRACT

Systems, methods and apparatus for efficient power control of an RF amplifier for amplification of a constant envelope RF signal are described. A reduction in a size of a pass device of an LDO regulator is obtained by removing the pass device of the LDO regulator from a main current conduction path of the RF amplifier. Power control is provided by varying one or more gate voltages to cascoded transistors of a transistor stack of the RF amplifier according to a power control voltage. Various configurations for controlling the gate voltages are presented by way of a smaller size LDO regulator or by completely removing the LDO regulator. In a case where a supply voltage to the transistor stack varies, such as in a case of a battery, a compensation circuit is used to adjust the power control voltage in view of a variation of the supply voltage, and therefore null a corresponding drift in output power of the RF amplifier.

30 Claims, 13 Drawing Sheets

(56) References Cited

U.S. PATENT DOCUMENTS

| | | |
|---|---|---|
| 5,032,799 A | 7/1991 | Milberger et al. |
| 5,041,797 A | 8/1991 | Belcher et al. |
| 5,119,042 A | 6/1992 | Crampton |
| 5,126,688 A | 6/1992 | Nakanishi |
| 5,331,221 A | 7/1994 | Ganesan et al. |
| 5,375,256 A | 12/1994 | Yokoyama et al. |
| 5,489,792 A | 2/1996 | Hu et al. |
| 5,610,555 A | 3/1997 | Funahashi et al. |
| 5,635,872 A | 6/1997 | Zimmerman |
| 5,732,334 A | 3/1998 | Miyake |
| 5,920,486 A | 7/1999 | Beahm et al. |
| 6,107,885 A | 8/2000 | Miguelez et al. |
| 6,111,462 A | 8/2000 | Mucenieks et al. |
| 6,137,367 A | 10/2000 | Ezzedine et al. |
| 6,191,653 B1 | 2/2001 | Camp, Jr. et al. |
| 6,225,665 B1 | 5/2001 | Hirano |
| 6,225,866 B1 | 5/2001 | Kubota et al. |
| 6,239,657 B1 | 5/2001 | Bauer |
| 6,242,979 B1 | 6/2001 | Li |
| 6,281,756 B1 | 8/2001 | Goto et al. |
| 6,297,696 B1 | 10/2001 | Abdollahian et al. |
| 6,307,237 B1 | 10/2001 | Erstad |
| 6,308,047 B1 | 10/2001 | Yamamoto et al. |
| 6,342,810 B1 | 1/2002 | Wright et al. |
| 6,366,172 B1 | 4/2002 | Hayashi et al. |
| 6,380,802 B1 | 4/2002 | Pehlke et al. |
| 6,396,352 B1 | 5/2002 | Muza |
| 6,449,465 B1 | 9/2002 | Gallus et al. |
| 6,466,082 B1 | 10/2002 | Krishnan |
| 6,496,074 B1 | 12/2002 | Sowlati |
| 6,509,799 B1 | 1/2003 | Franca-Neto |
| 6,515,547 B2 | 2/2003 | Sowltai |
| 6,636,114 B2 | 10/2003 | Tsutsui et al. |
| 6,658,265 B1 | 12/2003 | Steel et al. |
| 6,725,021 B1 | 4/2004 | Anderson et al. |
| 6,731,175 B1 | 5/2004 | Chen |
| 6,804,502 B2 | 10/2004 | Burgener et al. |
| 6,844,776 B2 | 1/2005 | Schell et al. |
| 6,853,244 B2 | 2/2005 | Robinson et al. |
| 6,853,247 B2 | 2/2005 | Weldon |
| 6,943,628 B2 | 2/2005 | Weldon |
| 6,864,750 B2 | 3/2005 | Shigematsu |
| 6,934,520 B2 | 8/2005 | Rozsypal |
| 7,043,213 B2 | 5/2006 | Robinson et al. |
| 7,071,786 B2 | 7/2006 | Inoue et al. |
| 7,135,919 B2 | 11/2006 | Chen |
| 7,135,929 B1 | 11/2006 | Costa et al. |
| 7,161,429 B2 | 1/2007 | Boreysha et al. |
| 7,202,712 B2 | 4/2007 | Athas |
| 7,202,734 B1 | 4/2007 | Raab |
| 7,248,120 B2 | 7/2007 | Burgener et al. |
| 7,248,845 B2 | 7/2007 | Dunn |
| 7,276,976 B2 | 10/2007 | Oh et al. |
| 7,352,247 B2 | 4/2008 | Oh et al. |
| 7,391,269 B2 | 6/2008 | Chiba |
| 7,440,733 B2 | 10/2008 | Maslennikov et al. |
| 7,457,594 B2 | 11/2008 | Theobold et al. |
| 7,545,216 B2 | 6/2009 | Harnley |
| 7,551,036 B2 | 6/2009 | Berroth et al. |
| 7,586,376 B2 | 9/2009 | Litmanen |
| 7,602,243 B2 | 10/2009 | Murao |
| 7,605,651 B2 | 10/2009 | Ripley et al. |
| 7,649,418 B2 | 1/2010 | Matsui |
| 7,684,514 B2 | 3/2010 | Saito et al. |
| 7,714,660 B2 | 5/2010 | Lesso et al. |
| 7,714,662 B2 | 5/2010 | Jeong et al. |
| 7,714,664 B2 | 5/2010 | Kanaya et al. |
| 7,739,522 B2 | 6/2010 | Festo et al. |
| 7,782,134 B2 | 8/2010 | Drogi et al. |
| 7,783,269 B2 | 8/2010 | Vinayak et al. |
| 7,786,807 B1 | 8/2010 | Li et al. |
| 7,795,968 B1 | 9/2010 | Li et al. |
| 7,808,342 B2 | 10/2010 | Prikhodko et al. |
| 7,817,966 B2 | 10/2010 | Prikhodko et al. |
| 7,868,683 B2 | 1/2011 | Ilkov |
| 7,868,697 B2 | 1/2011 | Arai |
| 7,889,005 B2 * | 2/2011 | Simon |
| 7,910,993 B2 | 3/2011 | Brindle et al. |
| 7,961,052 B2 | 6/2011 | Bacon et al. |
| 8,093,945 B2 | 1/2012 | Wimpenny |
| 8,106,711 B2 | 1/2012 | Adamski et al. |
| 8,111,104 B2 | 2/2012 | Ahadian et al. |
| 8,129,787 B2 | 3/2012 | Brindle et al. |
| 8,131,225 B2 | 3/2012 | Botula et al. |
| 8,131,251 B2 | 3/2012 | Burgener et al. |
| 8,232,627 B2 | 7/2012 | Bryant et al. |
| 8,278,893 B2 | 10/2012 | Motz |
| 8,310,313 B2 | 11/2012 | Guo et al. |
| 8,330,504 B2 | 12/2012 | Olson |
| 8,350,624 B2 | 1/2013 | Lam |
| 8,368,462 B2 | 2/2013 | Sharma et al. |
| 8,373,490 B2 | 2/2013 | Burgener et al. |
| 8,390,381 B2 | 3/2013 | Shen |
| 8,432,224 B1 | 4/2013 | Woo et al. |
| 8,487,706 B2 * | 7/2013 | Li |
| 8,493,142 B2 | 7/2013 | Tadano |
| 8,558,614 B2 | 10/2013 | Masuda et al. |
| 8,643,107 B2 | 2/2014 | Sleight et al. |
| 8,987,792 B2 | 3/2015 | Adamski et al. |
| 9,160,292 B2 | 10/2015 | Olson et al. |
| 9,160,376 B1 | 10/2015 | Scuderi |
| 9,219,445 B2 | 12/2015 | Nobbe et al. |
| 9,287,829 B2 | 3/2016 | Nobbe et al. |
| 9,413,298 B2 | 8/2016 | Nobbe et al. |
| 9,543,901 B2 | 1/2017 | Nobbe et al. |
| 9,590,674 B2 | 3/2017 | Olson |
| 9,667,195 B2 | 5/2017 | Nobbe et al. |
| 9,716,477 B2 | 7/2017 | Wagh et al. |
| 9,753,474 B2 | 9/2017 | Zhang et al. |
| 9,842,858 B2 | 12/2017 | Willard |
| 9,857,818 B1 | 1/2018 | Adamski |
| 2003/0032339 A1 | 2/2003 | Tsuchiya et al. |
| 2003/0090313 A1 | 5/2003 | Burgener et al. |
| 2003/0224743 A1 | 12/2003 | Okada et al. |
| 2004/0021501 A1 | 2/2004 | Das et al. |
| 2004/0121745 A1 | 6/2004 | Meck |
| 2004/0217372 A1 | 11/2004 | Chen |
| 2005/0007200 A1 * | 1/2005 | Inoue |
| 2005/0285684 A1 | 12/2005 | Burgener et al. |
| 2006/0009164 A1 | 1/2006 | Kataoka |
| 2006/0119435 A1 | 6/2006 | Oh et al. |
| 2006/0209984 A1 | 9/2006 | Kenington |
| 2006/0237726 A1 | 10/2006 | Iwamatsu et al. |
| 2006/0245517 A1 | 11/2006 | Ikedo et al. |
| 2007/0018718 A1 | 1/2007 | Horng et al. |
| 2007/0176233 A1 | 8/2007 | Ozawa et al. |
| 2007/0241402 A1 | 10/2007 | Hirano |
| 2007/0243849 A1 | 10/2007 | Prikhodko et al. |
| 2008/0079653 A1 | 4/2008 | Ahn et al. |
| 2008/0237713 A1 | 10/2008 | Doumae |
| 2008/0297128 A1 | 12/2008 | Xu et al. |
| 2009/0278610 A1 | 11/2009 | Murji |
| 2010/0039094 A1 | 2/2010 | Nagata et al. |
| 2010/0081239 A1 | 4/2010 | Min et al. |
| 2011/0002080 A1 | 1/2011 | Ranta |
| 2011/0043284 A1 | 2/2011 | Zhao |
| 2011/0070848 A1 | 3/2011 | Ramachandra Reddy |
| 2011/0181360 A1 | 7/2011 | Li et al. |
| 2012/0007679 A1 | 1/2012 | Burgener et al. |
| 2012/0169398 A1 | 3/2012 | Brindle et al. |
| 2012/0086512 A1 | 4/2012 | Sharma et al. |
| 2012/0194274 A1 | 8/2012 | Fowers et al. |
| 2012/0194276 A1 | 8/2012 | Fisher |
| 2012/0267719 A1 | 10/2012 | Brindle et al. |
| 2013/0222075 A1 | 8/2013 | Reedy et al. |
| 2013/0229235 A1 | 9/2013 | Ohnishi |
| 2014/0070315 A1 | 3/2014 | Levy et al. |
| 2014/0171010 A1 | 6/2014 | Olson |
| 2014/0184334 A1 | 7/2014 | Nobbe et al. |
| 2014/0184335 A1 | 7/2014 | Nobbe et al. |
| 2014/0184336 A1 | 7/2014 | Nobbe et al. |
| 2014/0184337 A1 | 7/2014 | Nobbe et al. |
| 2014/0210558 A1 | 7/2014 | Matsumoto |
| 2014/0264625 A1 | 9/2014 | Adamski et al. |

(56) References Cited

U.S. PATENT DOCUMENTS

| | | |
|---|---|---|
| 2014/0266456 A1 | 9/2014 | Vice et al. |
| 2015/0097624 A1 | 4/2015 | Olson et al. |
| 2015/0270806 A1 | 9/2015 | Wagh et al. |
| 2016/0164468 A1 | 6/2016 | Nobbe et al. |
| 2016/0164469 A1 | 6/2016 | Nobbe et al. |
| 2016/0190989 A1 | 6/2016 | Nobbe et al. |
| 2016/0241199 A1 | 8/2016 | Nobbe et al. |
| 2017/0141126 A1 | 5/2017 | Willard |
| 2017/0141134 A1 | 5/2017 | Willard |

FOREIGN PATENT DOCUMENTS

| | | |
|---|---|---|
| WO | WO2009/108391 | 9/2009 |
| WO | 2017087035 | 5/2017 |
| WO | 2017164904 | 9/2017 |

OTHER PUBLICATIONS

Adamski, Jaroslaw, "Improved Biasing for Lower Ron of LDO Pass Devices", patent application filed in the USPTO on Mar. 6, 2017, U.S. Appl. No. 15/451,178, 39 pgs.

Nguyen, Patricia T., Office Action received from the USPTO dated Oct. 25, 2005 for U.S. Appl. No. 10/875,405, 7 pgs.

Burgener, et al., Response filed in the USPTO dated Jan. 25, 2006 for U.S. Appl. No. 10/875,405, 18 pgs.

Nguyen, Patricia T., Office Action received from the USPTO dated Apr. 20, 2006 for U.S. Appl. No. 10/875,405, 10 pgs.

Nguyen, Patricia T., Notice of Allowance received from the USPTO dated Sep. 27, 2006 for U.S. Appl. No. 10/875,405, 6 pgs.

Burgener, et al., Response filed in the USPTO dated Aug. 21, 2006 for U.S. Appl. No. 10/875,405, 10 pgs.

Raab, et al., "Power Amplifiers and Transmitters for RF and Microwave", IEEE Transactions on Microwave Theory and Techniques, vol. 50, No. 3, pp. 814-826, Mar. 2002, USA.

Ueda, et al., "A 5GHz-Band On-Chip Matching CMOS MMIC Front-End", 11th GAAS Symposium—Munich 2003, pp. 101-104, Germany.

Nelson Pass, Pass Labs, "Cascode Amp Design", Audio Electrnoics, pp. 1-4, Mar. 1978.

Mishra, et al., "High Power Broadband Amplifiers for 1-18 GHz Naval Radar" University of California, Santa Barbara, pp. 1-9, Jul. 1, 1998.

Jeon, et al., "A New "Active" Predistorter with High Gain Using Cascode-FET Structures", IEEE Radio Frequency Integrated Circuits Symposium, 2002, pp. 253-256.

Hsu, et al., "Comparison of Conventional and Thermally-Stable Cascade (TSC) AlGaAs/GaAs HBTs for Microwave Power Applications", Jrnl of Solid-State Electronics, V. 43, Sep. 1999.

Kim, et al., "High-Performance V-Band Cascade HEMT Mixer and Downconverter Module", IEEE Transactions on Microwave Theory and Techniques, vol. 51, No. 3, p. 805-810,Mar. 2003.

Nguyen, Hieu P., Office Action received from the USPTO dated Sep. 21, 2017 for U.S. Appl. No. 15/415,768, 10 pgs.

Adamski, Jaroslaw, Response filed in the USPTO dated Oct. 6, 2017 for U.S. Appl. No. 15/415,768, 17 pgs.

Sterrett, Jeffery, Notice of Allowance received from the USPTO dated Oct. 18, 2017 for U.S. Appl. No. 15/451,178, 10 pgs.

Nguyen, Khiem D., Office Action received from the USPTO dated Oct. 20, 2016 for U.S. Appl. No. 14/626,833, 13 pgs.

Nguyen, Khiem D., Office Action received from the USPTO dated Apr. 21, 2016 for U.S. Appl. No. 14/626,833, 51 pgs.

Nguyen, Khiem D., Interview Summary received from the USPTO dated Dec. 15, 2016 for U.S. Appl. No. 14/626,833, 3 pgs.

Nguyen, Khiem D., Notice of Allowance received from the USPTO dated May 23, 2017 for U.S. Appl. No. 14/626,833, 27 pgs.

Wagh, et al., Response filed in the USPTO dated Jan. 20, 2017 for U.S. Appl. No. 14/626,833, 28 pgs.

Wagh, et al., Response filed in the USPTO dated Jun. 20, 2016 for U.S. Appl. No. 14/626,833, 33 pgs.

Hassan, et al., "A Combined Series-Parallel Hybrid Envelope Amplifier for Envelope Tracking Mobile Terminal RF Power Amplifier Applications", IEEE Journal of Solid-State Circuits, vol. 47, No. 5, May 2012, 14 pgs.

Asbeck, et al., "Design Options for High Efficiency Linear Handset Power Amplifiers" 2009 IEEE, 4 pgs.

Asbeck, et al., "CMOS Handset Power Amplifiers: Directions for the Future", Custom Integrated Circuits Conference (CICC), Sep. 2012 IEEE, 6 pgs.

Hassan, et al., "An Envelope—Tracking CMOS-SOS Power Amplifier with 50% Overall PAE and 29.3 dBm Output Power for LTE Applications." Compound Semiconductor Integrated Circuit Symposium (CSICS), Oct. 2012, 4 pgs.

Kavousian, et al. "A Digitally Modulated Polar CMOS PA with 20MHz Signal BW." IEEE International Solid-States Circuits Conference, Feb. 12, 2007, Session 4, RF Building Blocks, 4.1, 3 pgs.

Li, et al., "Design of High Efficiency Monolithic Power Amplifier with Envelope-Tracking and Transistor Resizing for Broadband Wireless Applications", IEEE Journal of Solid-State Circuits, vol. 47, No. 9, Sep. 2012, 12 pgs.

Niujira Ltd. "Envelope Tracking: unlocking the potential of CMOS Pas in 4G Smartphones." White Paper, Feb. 2013, 9 pgs.

Kim, et al. "Push the Envelope." IEEE Microwave Magazine, IMS Special Issue, May 2013, pp. 68-81.

Ahmed, et al., "DTX: A Revolutionary Digital Transmitter Technology to Provide Multi-Mode/Multi-Band Capability", Proceeding of the SDR 04 Technical Conference and Product Exposition, 2004, 5 pgs.

Sahu, et al. "A High Efficiency WCDMA RF Power Amplifier with Adaptive, Dual-Mode Buck-Boost Supply and Bias-Current Control." IEEE—Manuscript received on May 9, 2006, revised on Sep. 1, 2006, 3 pgs.

Asbeck, et al. "Si IC Development for High Efficiency Envelope Tracking Power Amplifiers." IEEE Microwave Magazine, 2012, pp. 1-4.

Kim, et al. "Efficiently Amplified." IEEE Microwave Magazine, Aug. 2010, pp. 87-100.

McCune, et al. "Microwave Bytes." IEEE Microwave Magazine, Jun. 2012, pp. 34-56.

Wimpenny, et al. Envelope Tracking GaAs HBT PA performance characterization under high load mismatch conditions, IEEE, 2012, pp. 37-40.

Lai, P.W. and Long, S.I. "A 5GHz CMOS Low Phase Noise Transformer Power Combining VCO." IEEE Radio Frequency Integrated Circuits (RFIC) Symposium, Jun. 2006, pp. 1-4.

Geynet, L. et al. "Fully-Integrated Multi-Standard VCOs with switched LC tank and Power Controlled by Body Voltage in 130nm CMOS/SOI" IEEE Radio Frequency Integrated Circuits (RFIC) Symposium, Jun. 2006, pp. 1-4.

Nguyen, Patricia T., Office Action received from the USPTO dated Nov. 14, 2014 for U.S. Appl. No. 13/830,680, 16 pgs.

Nguyen, Patricia T., Office Action received from the USPTO dated Dec. 1, 2014 for U.S. Appl. No. 13/830,070, 18 pgs.

Nguyen, Patricia T., Office Action received from the USPTO dated Dec. 9, 2014 for U.S. Appl. No. 13/830,555, 18 pgs.

Mottola, Steven J., Office Action received from the USPTO dated Jan. 29, 2015 for U.S. Appl. No. 14/049,165, 21 pgs.

Nobbe, et al., Amendment filed in the USPTO dated Feb. 16, 2015 for U.S. Appl. No. 13/830,680, 25 pgs.

Nobbe, et al., Response filed in the USPTO dated Feb. 26, 2015 for U.S. Appl. No. 13/830,070, 13 pgs.

Nobbe, et al., Response filed in the USPTO dated Mar. 9, 2015 for U.S. Appl. No. 13/830,555, 15 pgs.

Nguyen, Patricia T., Notice of Allowance received from the USPTO dated Mar. 18, 2015 for U.S. Appl. No. 13/830,680, 11 pgs.

Olson, et al., Response filed in the USPTO dated Mar. 28, 2015 for U.S. Appl. No. 14/049,165, 21 pgs.

Nguyen Patricia T., Notice of Allowance received from the USPTO dated Apr. 29, 2015 for U.S. Appl. No. 13/830,070, 17 pgs.

Mottola, Steven J., Notice of Allowance received from the USPTO dated May 29, 2015 for U.S. Appl. No. 14/049,165, 9 pgs.

Nguyen, Khiem D., Office Action received from the USPTO dated Sep. 11, 2014 for U.S. Appl. No. 13/829,946, 9 pgs.

(56) References Cited

OTHER PUBLICATIONS

Nguyen, Khiem D., Office Action received from the USPTO dated Feb. 23, 2015 for U.S. Appl. No. 13/829,946, 9 pgs.
Nobbe, et al., Response filed in the USPTO dated Dec. 11, 2014 for U.S. Appl. No. 13/829,946, 2 pgs.
Nobbe, et al., Response filed in the USPTO dated May 22, 2015 for U.S. Appl. No. 13/829,946, 23 pgs.
Bult, et al., "The CMOS Gain-Boosting Technique", Philips Research Laboratories, Eindhoven, The Netherlands, J.H. Huijsing, et al., Analog Circuit Design, 1993, 26 pgs.
Ezzeddine, et al., "The High Voltage/High Power FET (HiVP1)", 2003 IEEE Radio Frequency Integrated Circuits Symposium, pp. 215-218.
Nguyen, Patricia T., Office Action received from the USPTO dated Aug. 27, 2015 for U.S. Appl. No. 13/830,680, 14 pgs.
Nobbe, et al., Response filed in the USPTO dated Sep. 9, 2015 for U.S. Appl. No. 13/829,946, 14 pgs.
Nguyen, Patricia T., Notice of Allowance received from the USPTO dated Sep. 14, 2015 for U.S. Appl. No. 13/830,070, 15 pgs.
Nobbe, et al., Response filed in the USPTO dated Oct. 27, 2015 for U.S. Appl. No. 13/830,680, 16 pgs.
Nguyen, Khiem D, Office Action received from the USPTO dated Jul. 30, 2015 for U.S. Appl. No. 13/829,946, 11 pgs.
Nguyen, Patricia T., Notice of Allowance received from the USPTO dated Nov. 20, 2015 for U.S. Appl. No. 13/830,555, 41 pgs.
Nguyen, Khiem D., Notice of Allowance received from the USPTO dated Dec. 21, 2015 for U.S. Appl. No. 13/829,946, 11 pgs.
Nguyen, Patricia T., Office Action received from the USPTO dated Jan. 29, 2016 for U.S. Appl. No. 13,830,680, 5 pgs.
Nguyen, Khiem D., Notice of Allowance received from the USPTO dated Mar. 11, 2016 for U.S. Appl. No. 13/829,946, 7 pgs.
Nobbe, et al., Response filed in the USPTO dated Mar. 23, 2016 for U.S. Appl. No. 13/830,680, 15 pgs.
Nguyen, Patricia T., Office Action received from the USPTO dated Jun. 2, 2016 for U.S. Appl. No. 13/830,680, 18 pgs.
Nguyen, Patricia T., Notice of Allowance received from the USPTO dated Aug. 16, 2016 for U.S. Appl. No. 14/858,772, 16 pgs.
Nobbe, et al., Response filed in the USPTO dated Aug. 22, 2016 for U.S. Appl. No. 13/830,680, 13 pgs.
Nguyen, Patricia T., Office Action received from the USPTO dated Oct. 28, 2016 for U.S. Appl. No. 14/821,501, 17 pgs.
Nguyen, Patricia T., Notice of Allowance received from the USPTO dated Nov. 4, 2016 for U.S. Appl. No. 13/830,680, 11 pgs.
Nobbe, et al., Response filed in the USPTO dated Jan. 24, 2017 for U.S. Appl. No. 14/821,501, 23 pgs.
Nguyen, Khiem D., Office Action received from the USPTO dated Jan. 27, 2017 for U.S. Appl. No. 14/958,848, 9 pgs.
Nguyen, Khiem D., Office Action received from the USPTO dated Mar. 23, 2017 for U.S. Appl. No. 15/040,952, 9 pgs.
Nobbe, et al., Response filed in the USPTO dated Mar. 24, 2017 for U.S. Appl. No. 14/958,848, 11 pgs.
Nobbe, et al., Response filed in the USPTO dated Mar. 14, 2017 for U.S. Appl. No. 15/040,952, 8 pgs.
Nguyen, Patricia T., Notice of Allowance received from the USPTO dated Nov. 25, 2015 for U.S. Appl. No. 13/830,070, 11 pgs.
Nobble, et al., Response filed in the USPTO dated Jul. 29, 2015 for U.S. Appl. No. 13/830,070, 3 pgs.
Nobbe, et al., Response filed in the USPTO dated Feb. 29, 2016 for U.S. Appl. No. 13/829,946, 3 pgs.
Nobbe, et al., Response filed in the USPTO dated Jun. 18, 2015 for U.S. Appl. No. 13/830,680, 3 pgs.
Nobbe, et al., Response filed in the USPTO dated Jan. 27, 2016 for U.S. Appl. No. 13/830,555, 3 pgs.
Nhu, David, Office Action received from the USPTO dated May 21, 2014 for U.S. Appl. No. 13/826,566, 6 pgs.
Nhu, David, Office Action received from the USPTO dated Aug. 6, 2014 for U.S. Appl. No. 13/826,566, 9 pgs.
Nhu, David, Notice of Allowance received from the USPTO dated Nov. 14, 2014 for U.S. Appl. No. 13/826,566, 7 pgs.
Adamski, et al., Response filed in the USPTO dated Jul. 16, 2014 for U.S. Appl. No. 13/826,566, 3 pgs.
Adamski, et al., Response filed in the USPTO dated Nov. 5, 2014 for U.S. Appl. No. 13/826,566, 7 pgs.
Jeong, J. et al. "A 20 dBm Linear RF Power Amplifier Using Stacked Silicon-on-Sapphire MOSFETs." IEEE Microwave and Wireless Compenents Letters, vol. 16 (12), Dec. 2006, pp. 684-686.
Apostolidou, M. et al. "A 65nm CMOS 30dBm Class-E RF Power Amplifier with 60% Power Added Efficiency." IEEE Radio Frequency Integrated Circuits Symposium, 2008, pp. 141-144.
Choe, Henry, Office Action received from the USPTO dated Feb. 2, 2011 for U.S. Appl. No. 12/657,728, 12 pgs.
Choe, Henry, Office Action received from the USPTO dated Jun. 15, 2011 for U.S. Appl. No. 12/657,728, 4 pgs.
Choe, Henry, Advisory Action received from the USPTO dated Sep. 20, 2011 for U.S. Appl. No. 12/657,728, 2 pgs.
Choe, Henry, Notice of Allowance received from the USPTO dated Nov. 1, 2012 for U.S. Appl. No. 12/657,728, 10 pgs.
Choe, Henry, Notice of Allowance received from the USPTO dated Mar. 14, 2013 for U.S. Appl. No. 12/657,728, 14 pgs.
Li, et al., Response filed in the USPTO dated Sep. 14, 2011 for U.S. Appl. No. 12/657,728, 10 pgs.
Li, et al., Response filed in the USPTO dated Jun. 2, 2011 for U.S. Appl. No. 12/657,728, 17 pgs.
Sowlati, Tirdad, "A 2.4-GHz 0/18-um CMOS Self-Biased Cascade Power Amplifier", IEEE Journal or Solid-State Circuits, vol. 38, No. 8, Aug. 2003, pp. 1318-1324.
Ko, Sangwon, et al., "A Linearized Cascode CMOS Power Amplifier", Electrical and Computer Engineering Dept., Univ. of Florida, IEEE, 2006, 4 pgs.
Webster, D.R., et al., "Novel Circuit Synthesis Technique using Short Channel GaAs FETS Giving Reduced Intermodulation Distortion", Dept. of Electronic and Electrical Engineering, University College, London, IEEE 1995, pp. 1348-1351.
Webster, Danny, et al., "Control of Circuit Distortion by the Derivative Superposition Method", IEEE Microwave and Guided Wave Letter, vol. 6, No. 3, Mar. 1996, pp. 123-125.
Van Der Heijden, Mark, et al., "Theory and Design of an Ultra-Linear Square-Law Approximated LDMOS Power Amplifier in Class-AB Operation", IEEE Transactions on Microwave Theory and Techniques, vol. 50, No. 9, Sep. 2002, pp. 2176-2184.
Kim, Bonkee, et al., "A New Linearization Technique for MOSFET RF Amplifier using Multiple Gated Transistors", IEEE Micro. and Guided Wave Ltrs, V. 10, No. 9, Sep. 2000, 371-373.
Jeon, Moon-Suk, et al., "A New "Active" Predistortor with High Gain using Cascode-FET Structures", MO4D-4, 2002 IEEE Radio Frequency Integrated Circuits Symposium, p. 253-2.
Aoki, Ichiro, et al., "Fully Integrated CMOS Power Amplifier Design Using the Distributed Active-Transformer Architecture" IEEE Journal of Solid-State Circuits, vol. 37, No. 3, Mar. 2002, pp. 371-383.
McRory, John, et al., "Transformer Coupled Stacked FET Power Amplifiers", IEEE Journal of Solid-State Circuits, vol. 34, No. 2, Feb. 1999, pp. 157-161.
Ding, Yongwang, et al., "A High-Efficiency CMOS +22-dBm Linear Power Amplifier", IEEE Journal of Solid-State Circuits, vol. 40, No. 9, Sep. 2005, pp. 1895-1900.
Shifrin, Mitchell B., "Monolithic FET Structures for High-Power Control Component Applications", IEEE Transactions on Microwave Theory and Techniques, vol. 37, No. 12 , Dec. 1989, p. 2134-2141.
Chen, Junpeng, Office Action received from the USPTO dated Dec. 4, 2014 for U.S. Appl. No. 13/715,805, 19 pgs.
Chen, Junpeng, Final Office Action received from the USPTO dated Jun. 18, 2015 for 13/715,805, 18 pgs.
Chen, Junpeng, Office Action received from the USPTO dated Dec. 31, 2015 for U.S. Appl. No. 13/715,805, 158 pgs.
Chen, Junpeng, Final Office Action received from the USPTO dated Jun. 27, 2016 for U.S. Appl. No. 13/715,805, 20 pgs.
Chen, Junpeng, Notice of Allowance received from the USPTO dated Oct. 24, 2016 for U.S. Appl. No. 13/715,805, 14 pgs.
Olson, Chris, Response filed in the USPTO dated Sep. 27, 2016 for U.S. Appl. No. 13/715,805, 15 pgs.

(56) References Cited

OTHER PUBLICATIONS

Olson, Chris, Response filed in the USPTO dated Mar. 23, 2016 for U.S. Appl. No. 13/715,805, 23 pgs.
Olson, Chris, Response filed in the USPTO dated Sep. 16, 2015 for U.S. Appl. No. 13/715,805, 19 pgs.
Olson, Chris, Response filed in the USPTO dated Mar. 3, 2015 for U.S. Appl. No. 13/715,805, 17 pgs.
Olson, Chris, Statement of the Substance of Applicant-Initiated Interview of Dec. 17, 2014 filed in the USPTO dated Mar. 3, 2015 for U.S. Appl. No. 13/715,805, 3 pgs.
Chen, Junpeng, Applicant-Initiated Interview Summary received from the USPTO dated Dec. 23, 2014 for U.S. Appl. No. 13/715,805, 3 pgs.
Stowe, Scott C., Office Action received from the USPTO dated Sep. 13, 2016 for U.S. Appl. No. 14/945,323, 9 pgs.
Stowe, Scott C., Office Action received from the USPTO dated Feb. 21, 2017 for U.S. Appl. No. 14/945,323, 29 pgs.
Willard, Simon, Response filed in the USPTO dated Nov. 3, 2016 for U.S. Appl. No. 14/945,323, 4 pgs.
MIT Lincoln Laboratory, "MITLL Low-Power FDSOI CMOS Process" Application Notes, Jun. 2006, 40 pgs.
Ren John Z., "Low Voltage SOI MOSFET with Suppressed Floating Body Effects", Department of Electrical and Computer Engineering, University of Toronto, 1999, 81 pgs.
Bernstein, et al., "SOI Circuit Design Concepts", Kluwer Academic Publishers, 2000, pp. 22-23.
Meierewert, Klaus, International Search Report and Written Opinion received from the EPO dated Sep. 8, 2016 for appln. No. PCT/US2016/040193, 12 pgs.
Meierewert, Klaus, International Search Report and Written Opinion received from the EPO dated Sep. 8, 2016 for appln. No. PCT/US2016/039894, 11 pgs.
Dang, Phuc T., Office Action received from the USPTO dated Mar. 27, 2017 for U.S. Appl. No. 15/078,930, 6 pgs.
Dang, Phuc T., Office Action received from the USPTO dated Jul. 20, 2017 for U.S. Appl. No. 15/078,930, 6 pgs.
Dang, Phuc T., Notice of Allowance received from the USPTO dated Sep. 22, 2017 for U.S. Appl. No. 15/078,930, 5 pgs.
Willard, Simon, Response filed in the USPTO dated Jun. 21, 17 for U.S. Appl. No. 15/078,930, 4 pgs.
Willard, Simon, Response filed in the USPTO dated Aug. 4, 2017 for U.S. Appl. No. 15/078,930, 6 pgs.
Juhl, Andreas, Written Opinion received from the EPO dated 20/24/17 for appln. No. PCT/US2016/039894, 6 pgs.
Nguyen, Khiem D., Notice of Allowance received from the USPTO dated Dec. 20, 2017 for U.S. Appl. No. 15/040,952, 15 pgs.
Nguyen, Hieu P., Notice of Allowance received from the USPTO dated Dec. 28, 2017 for U.S. Appl. No. 15/415,768, 9 pgs.

* cited by examiner ns may be related to U.S. patent
STACKED PA POWER CONTROL

CROSS-REFERENCE TO RELATED APPLICATIONS

The present application may be related to U.S. patent application Ser. No. 15/415,768, filed on Jan. 25, 2017, entitled "LDO with Fast Recovery from Saturation", the disclosure of which is incorporated herein by reference in its entirety. The present application may also be related to U.S. patent application Ser. No. 15/451,178, filed on Mar. 6, 2017, entitled "Improved Biasing for Lower $R_{ON}$ of LDO Pass Devices", the disclosure of which is incorporated herein by reference in its entirety. The present application may also be related to U.S. Pat. No. 7,248,120, issued on Jul. 24, 2007, entitled "Stacked Transistor Method and Apparatus", the disclosure of which is incorporated herein by reference in its entirety. The present application may also be related to Published US Application No. 2015/0270806 A1, published Sep. 24, 2015, entitled "Bias Control for Stacked Transistor Configuration", the disclosure of which is incorporated herein by reference in its entirety. The present application may also be related to U.S. Pat. No. 9,219,445 entitled "Optimization Methods for Amplifier with Variable Supply Power", issued Dec. 22, 2015, the disclosure of which is incorporated herein by reference in its entirety. The present application may also be related to U.S. Pat. No. 8,987,792 B2, entitled "Merged Active Devices on a Common Substrate", issued Mar. 24, 2015, the disclosure of which is incorporated herein by reference in its entirety. The present application may also be related to U.S. Pat. No. 8,487,706 B2 entitled "Stacked Linear Power Amplifier with Capacitor Feedback and Resistor Isolation", issued Jul. 16, 2013, the disclosure of which is incorporated herein by reference in its entirety. The present application may also be related to U.S. application Ser. No. 14/945,323, entitled "Butted Body Contact for SOI Transistor", filed on Nov. 18, 2015, the disclosure of which is incorporated herein by reference in its entirety. The present application may also be related to Published US Application No. 2014/0171010 A1, published Jun. 19, 2014, entitled "Semiconductor Devices with Switchable Ground-Body Connection", the disclosure of which is incorporated herein by reference in its entirety. The present application may also be related to U.S. application Ser. No. 15/078,930, entitled "Butted Body Contact for SOI Transistor", filed on Mar. 23, 2016, the disclosure of which is incorporated herein by reference in its entirety. The present application may also be related to Published US Application No. US 2014/0184336 A1, published Jul. 3, 2014, entitled "Amplifier Dynamic Bias Adjustment for Envelope Tracking", the disclosure of which is incorporated herein by reference in its entirety. The present application may also be related to Published US Application No. 2014/0184335 A1, published Jul. 3, 2014, entitled "Amplifiers Operating in Envelope Tracking Mode or Non-Envelope Tracking Mode", the disclosure of which is incorporated herein by reference in its entirety. The present application may also be related to Published US Application No. 2014/0184337 A1, published Jul. 3, 2014, entitled "Control Systems and Methods for Power Amplifiers Operating in Envelope Tracking Mode", the disclosure of which is incorporated herein by reference in its entirety.

TECHNICAL FIELD

The present application generally relates to electronic circuits, and more specifically to output power control of a stacked amplifier for applications where a constant envelope input signal is amplified.

BACKGROUND

In cases where a constant envelope radio frequency (RF) signal is desired to be amplified, output power to an amplifier can be provided by way of a low dropout (LDO) regulator whose pass device (or devices) conducts power to the amplifier. In cases where the amplifier, for example, a power amplifier, is a stacked amplifier comprising a plurality of series connected transistors, the pass device is coupled to a drain of an output transistor of the stacked amplifier, to provide a desired voltage at the drain commensurate with a desired output power of the stacked amplifier. Such scheme is used, for example, in a GSM (Global System for Mobile communication) amplifier (e.g. power amplifier), where an LDO regulator with a PMOS pass device coupled to the drain of the output transistor controls the output power of the amplifier. Since such GSM amplifier can draw in excess of 2 amps during a burst of the output power, the PMOS pass device must be sized for very low ON resistance to prevent the LDO regulator from saturating and causing an IR drop (i.e. voltage drop across the ON resistance) which would drop the output power and make the power control inaccurate. For this reason, the PMOS pass device is usually extremely large, which results in higher die size and cost. It follows that there is a desire to either eliminate or reduce the size of the LDO regulator.

SUMMARY

According to a first aspect of the present disclosure, a circuital arrangement is presented, the circuital arrangement comprising: a stack of a plurality of transistors arranged in a cascode configuration, comprising: (i) an input transistor adapted to receive an input radio frequency (RF) signal; and (ii) one or more cascoded transistors, the one or more cascoded transistors comprising an output transistor adapted to output, at an adjustable output power, an output RF signal based on the input RF signal, wherein: the adjustable output power is controlled by varying at least one gate voltage of the one or more cascoded transistors of the stack.

According to a second aspect of the present disclosure, a method for controlling an output power of an amplifier arrangement is presented, the method comprising: providing a stack of a plurality of transistors arranged in a cascode configuration, comprising an input transistor and one or more cascoded transistors, the one or more cascoded transistors comprising an output transistor; supplying a supply voltage across the stack; providing gate voltages to the one or more cascoded transistors; inputting a constant envelope radio frequency (RF) signal to the input transistor; based on the inputting, obtaining an amplified RF signal at the output transistor; varying at least one gate voltage of the gate voltages to the one or more cascoded transistors; and based on the varying, controlling the output power of the amplified RF signal.

The details of one or more embodiments of the invention are set forth in the accompanying drawings and the description below. Other features, objects, and advantages of the invention will be apparent from the description and drawings, and from the claims.

DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

Like reference numbers and designations in the various drawings indicate like elements.

DETAILED DESCRIPTION

Figure 1:
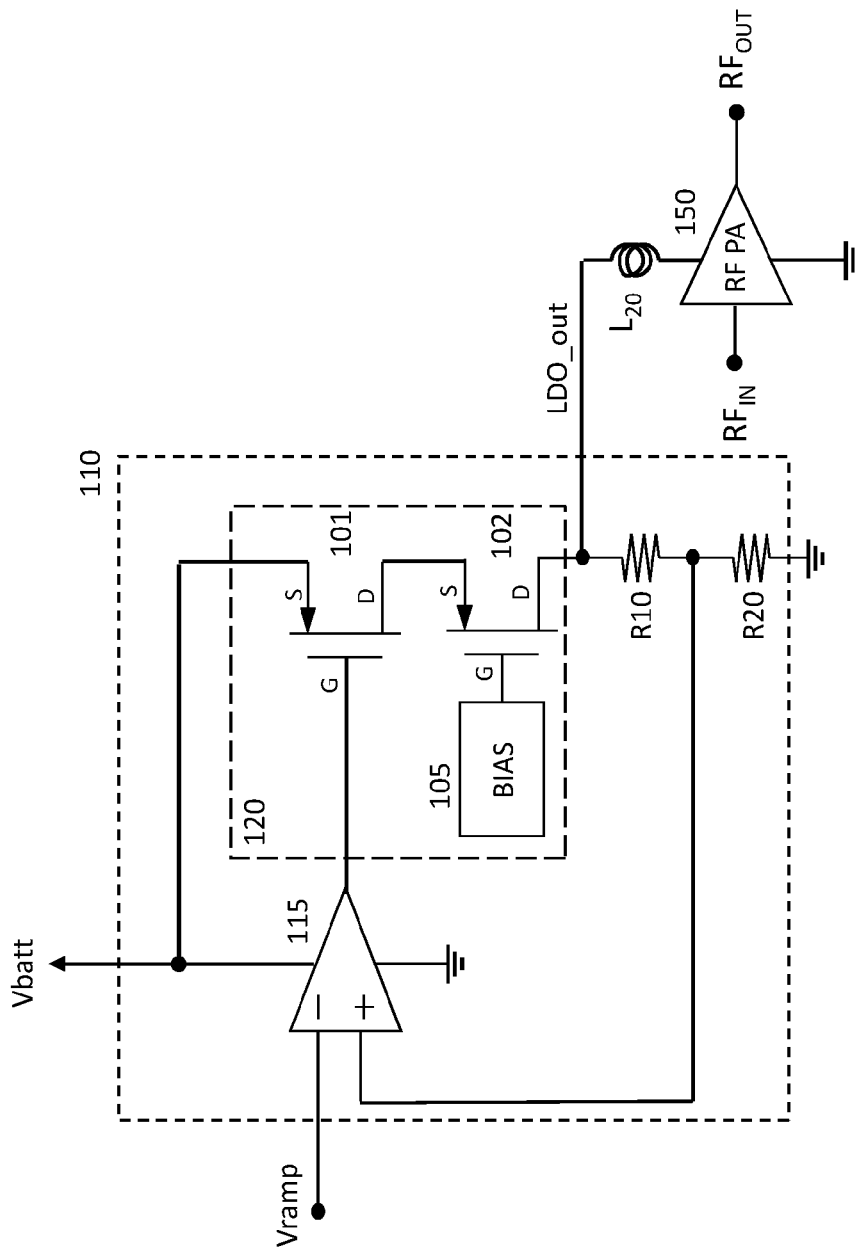
FIG. 1 is a simplified schematic representation of a prior art RF power amplifier whose output power is controlled by an LDO regulator. Power to the RF power amplifier is controlled by a control voltage, Vramp, input to a low power amplifier of the LDO regulator, where the LDO regulator outputs a power, based on the Vramp control voltage and a supply voltage (Vbatt).

As shown in the simplified schematic representation of the prior art RF power amplifier (RF PA) of FIG. 1, an LDO regulator (110) can be used to control power to an RF power amplifier (150). The LDO regulator comprises a low power OpAmp (115) which drives a high current pass device (101) to provide power to the RF PA (150). If necessary, one or more additional second pass devices (102) can be used in a cascode configuration to allow for a larger voltage drop across the combination of the pass devices (101, 102), where the larger voltage drop can be substantially equal to the voltage of the supply Vbatt (e.g. nominal supply voltage of 3.5 volts for a handheld cell phone). A person skilled in the art would know that the pass devices can be in a cascoded configuration with a dedicated biasing circuit (105) for biasing the additional device. More information on such configuration and the controlling of the pass devices can be found, for example, in the above referenced U.S. patent application Ser. No. 15/415,768, and whose disclosures are incorporated herein by reference.

With further reference to FIG. 1, the RF PA (150) can be used to generate RF power in a GSM system, where the burst of GSM RF power is controlled by the LDO_out voltage that varies between a low voltage corresponding to, for example, essentially no power, and a high voltage that corresponds to maximum power. An output dynamic range of the RF power amplifier is thereby set via the LDO_out voltage, where the dynamic range may be different according to different applications (e.g. non-GSM applications with constant input RF envelope). Although the embodiments as described herein are exemplified by a power amplifier designed for a GSM application, a person skilled in the art can readily apply the inventive concepts as disclosed herein to other types of applications where it is desired to control amplification of a constant envelope signal.

With continued reference to FIG. 1, the LDO_out voltage that controls the RF power to the RF PA (150) is controlled by the Vramp control voltage fed to the inverting input of the OpAmp (115). In one exemplary embodiment, the Vramp is within a range of [0, 1.6] volts which corresponds to a scale factor of approximately 3.4/1.6 with respect to the LDO_out voltage for a case where the supply voltage Vbatt is 3.4 volts. Such scale factor can be provided by a scaling circuit comprising the resistors R1, R2 which divide the LDO_out voltage according to the scaling factor. Other scaling factors may be envisioned, depending on a design goal, using the same or a different scaling circuit. A person skilled in the art would know of many different design implementations of such scaling circuit to scale the LDO_out voltage using, for example, gain/attenuation and offset functions.

As known to a person skilled in the art, GSM transmission occurs in specific RF bursts that can be controlled by the Vramp signal input to the OpAmp (115). In order to provide conduction of a high current (e.g. 2 amps and beyond) during a high power phase of the RF bursts through the pass device(s) of the LDO, the pass device is designed with a very large size so as to provide a very low ON resistance ($R_{ON}$) to prevent a high voltage drop across the pass device and maximize efficiency of the RF PA (150) at maximum RF power. In one exemplary case, the pass device is a PMOS device with a gate width of 32 mm and occupies an area of 1 mm×0.4 mm. It follows that the various embodiments of the present disclosure can allow elimination of the LDO regulator, and therefore of the bulky pass device, and/or use an LDO regulator with a reduced size pass device.

Figure 2:
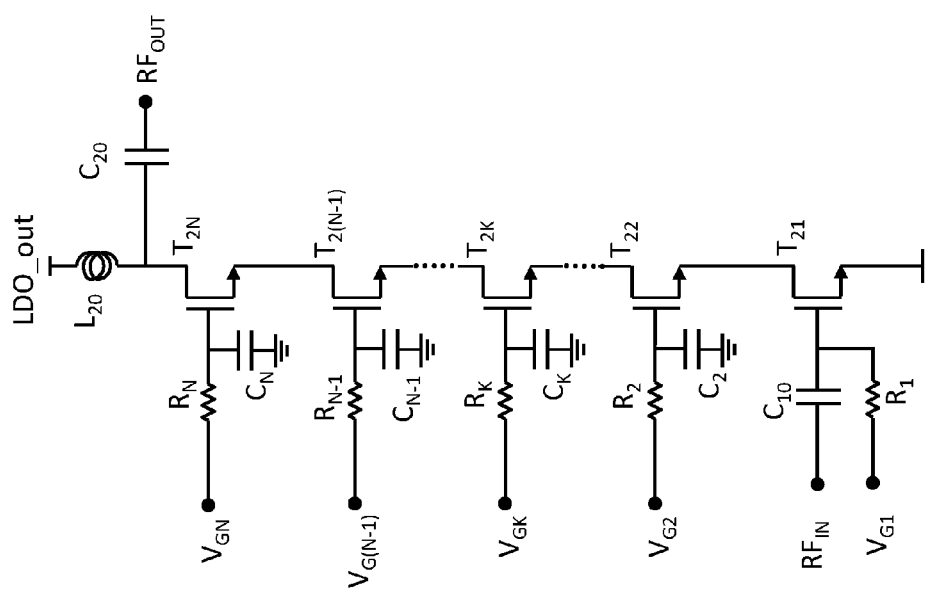
FIG. 2 shows a simplified schematic representation of a stacked amplifier (150) comprising a plurality of series connected transistors, including an input transistor (T21), an output transistor (T2N), and cascoded transistors (T22, . . . , T2N). Power to the stacked amplifier (150) is provided by way of an LDO regulator coupled to a drain of the output transistor (T2N). The stacked amplifier (150) can amplify a constant envelope input signal, $RF_{IN}$, and output an output signal, $RF_{OUT}$, whose power is controlled by the LDO regulator.

FIG. 2 shows a simplified schematic of a prior art stacked cascode (RF) amplifier (150) which can be used as the RF amplifier of FIG. 1. By way of example and not of limitation, the stacked cascode amplifier (150) can comprise a stack of FET transistors (T21, T22, . . . , T2N) that are arranged in a cascoded configuration. An input RF signal, RFin, provided at a gate terminal of the input transistor T21 of the amplifier (150) is amplified by the amplifier (150) based on the voltage LDO_out provided to the drain of the output transistor (T2N). A corresponding amplified output RF signal, RFout, is provided at the drain of the output transistor, T2N, and routed to an output terminal of the amplifier through a coupling capacitor C20. Coupling capacitors C10 and C20 can be used to decouple low frequency (e.g., DC) biasing voltages provided to the stack of transistors (transistor stack) from the RFin and RFout signals. The supply voltage from the LDO regulator (e.g. 110 of FIG. 1), LDO_out, is provided to the drain of the output transistor, T2N, through an inductor, L20, and a reference voltage (e.g., GND) is connected to a source of the input transistor T21. Biasing voltages at nodes (VG2, VG3, . . . , VGN) are provided to respective gates of the cascode transistors (T22, T23, . . . , T2N) via series resistors (R2, R3, . . . , RN). Biasing voltage to the input transistor, T21, can be provided at the node VG1. Various biasing circuits to generate such gate voltages to the RF amplifier (200) are described, for example, in the above referenced U.S. Pat. No. 9,219,445, U.S. Pat. No. 8,487,706 B2, to Published US Application No. 2014/0184335 A1, Published US Application No. US 2014/0184336 A1, Published US Application No. 2014/0184337 A1, and Published US Application No. 2015/0270806.

With further reference to the amplifier (150) depicted in FIG. 2, the biasing voltages at node (VG2, VG3, . . . , VGN) are such that each transistor (T21, T22, . . . , T2N) of the stack is biased according to a voltage compliance of the transistor. In other words, a voltage across any two terminals (e.g., gate, source, and drain) of the transistor is within a safe operating range of the transistor. As failure of transistor can be a statistical function of applied voltages across the transistors, even when such voltages are within the safe operating range, in some embodiments it may be desirable to subject the transistors of the stack to the same voltage ranges so as to provide an equal life expectancy (e.g., mean time before failure) for each transistor of the stack.

With further reference to the RF amplifier (150) of FIG. 2, according to an exemplary embodiment, the gate biasing voltages at nodes (VG2, VG3, . . . , VGN) can be configured to evenly distribute the voltage across the transistor stack, LDO_out, amongst the stacked transistors (T21, T22, . . . , T2N). In other words, a drain to source voltage, VDS, of each transistor (T21, T22, . . . , T2N) of the stack is made to be substantially equal to a quarter (1/N) of the LDO_out voltage provided to the drain of the output transistor T2N. This can be done, for example in a case of a stack of four transistors (N=4), as described in the above referenced Published US Application No. 2015/0270806 A1, whose disclosure is incorporated herein by reference in its entirety, by biasing the gates of the transistors (T24, T23, T22) with respective biasing voltages at nodes (VG4, VG3, VG2) equal to LDO_out×3/4+VGS, LDO_out×2/4+VGS, and LDO_out×1/4+VGS, where VGS is a gate to source voltage of the cascoded transistors (T22, T23, T24). According to other exemplary embodiments, unequal distribution of the voltage LDO_out amongst the stacked transistors may be provided, while operating each of the transistors of the stack within its safe operating range.

A person skilled in the art would understand that during operation of the amplifier (150) of FIG. 2, an amplified RF signal at the drain of the output transistor T2N can be at a voltage level substantially higher than the supply voltage LDO_out. This means that if the gate voltage of the output transistor T2N, as provided by the node VGN, is maintained at a fixed voltage level, and therefore the source of T2N is maintained to a fixed voltage level (e.g., LDO_out×3/4+ VGS for a case where N=4), then the drain to source voltage, VDS, of the output transistor T2N can be subjected to higher voltage excursions (including the RF signal), which can be beyond the tolerable voltage range of the transistor. Unequal voltage distribution of the voltage LDO_out by way of gate biasing voltages, as discussed above, may help to reduce stress exerted on the output transistor T2N due to unequal RF voltage distribution across the transistors of the stack, but may not be sufficient.

Based on the above, it can be desirable to control the stress on the individual transistors of the stack, due to unequal RF voltage division of the voltage at the drain of the output transistor T2N across the transistors (T21, T22, ..., T2N), which may subject any one of the transistors to a voltage beyond the tolerable voltage range of the transistor (e.g. close to or larger than its limit breakdown voltage). This can be accomplished by configuring the gates of the transistors (T22, T23, ..., T2N) of the stack to float via insertion of a gate capacitor (C2, C3, ..., CN) as depicted in FIG. 2. The value of the gate capacitor is chosen so to allow the gate voltage to vary along (float) with the RF signal at the drain of the corresponding transistor, which consequently allows control of the voltage drop (e.g., VDS) across the corresponding transistor, thus controlling the conduction of the transistor in accordance to the voltage at its drain, for a more efficient operation of the transistor. The (RF) voltage across the transistors (e.g. VDS) can therefore be equalized by choosing the correct combination of gate capacitor and gate bias voltage for each of the transistors. Teachings about this floating technique, also referred to as conduction controlling circuit, can be found in the above referenced U.S. Pat. No. 7,248,120, which is incorporated herein by reference in its entirety. According to some exemplary embodiments, the gate capacitors can provide substantially equal RF voltage division across the transistors of the stack.

A person skilled in the art would know that performance characteristic of the RF amplifier (150) depicted in FIG. 2 is mainly a function of a performance of the input transistor, T21. The input transistor T21 operates as a transconductor that translates an input voltage of the RFin signal to a current that conducts through the transistor stack (T21, T22, ..., T2N) and ultimately defines an RF voltage at the drain of the output device T2N. It is therefore desirable to have an input transistor of the stack with good output impedance (VDS/IDS). Furthermore, the person skilled in the art would understand that biasing of the cascoded transistors (T22, T23, ..., T2N) can be mainly be based on operation of such cascoded devices in their respective saturation regions of operation.

The embodiments as described herein are exemplified by an N-type MOSFET device, as shown in FIG. 2, used as a main conduction element of the RF amplifier (150). Such device can be part of a stack, where a plurality of such devices is connected in series so as to operate as a cascode, as shown in FIG. 2. A person of ordinary skill in the art will readily apply the inventive concepts as disclosed herein to other types of semiconductor devices, such as a P-type MOSFET device. The embodiments, according to the present invention, can also be applied to extended drain devices, such as laterally diffused metal oxide semiconductor (LDMOS) devices, and other gated transistors or devices. According to various embodiments of the present disclosure, such FET devices may include metal-oxide-semiconductor (MOS) field effect transistors (FETs), complementary metal-oxide-semiconductor (CMOS) FETs, and particularly to MOSFETs and CMOSFETs fabricated on silicon-on-insulator (SOI) and silicon-on-sapphire (SOS) substrates.

Figure 3:
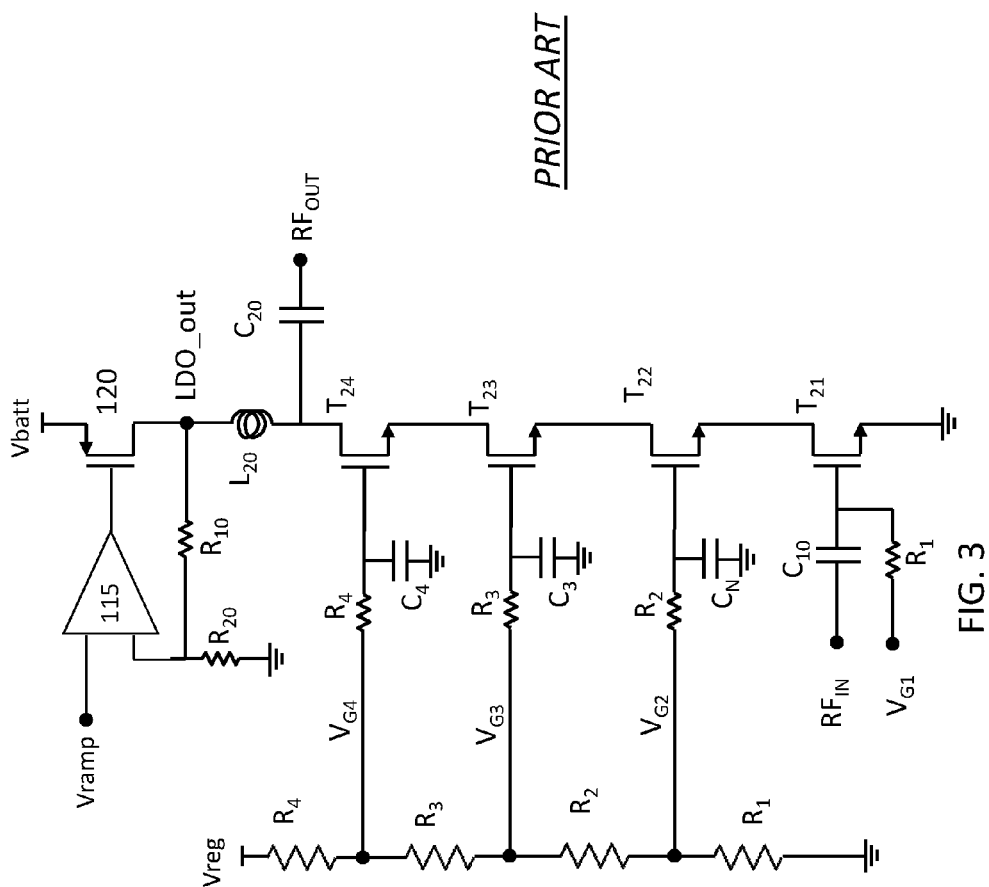
FIG. 3 shows a simplified schematic representation of a prior art RF power amplifier whose output power is controlled by an LDO regulator (115, 120) coupled to a drain of an output transistor (T24) of the RF power amplifier. The RF power amplifier depicted in FIG. 3 is a stacked amplifier comprising an input transistor (T21) and three cascoded transistors (T22, T23, T24) whose gates are biased with fixed voltages provided by a resistor tree.

A person skilled in the art readily knows that an SOI MOSFET device (e.g. T3, T4 of FIG. 1A, 1B) can be formed in a thin layer of silicon which overlies an insulating layer of an SOI substrate. Accordingly, and as known in the art, the SOI MOSFET device can be referred to as a thin-film SOI MOSFET, the thin-film referring to the thin layer of silicon. It should be noted that the various embodiments according to the present disclosure which will be described below can be implemented in thin-film SOI MOSFET devices. A more detailed description of such SOI MOSFET device can be found, for example, in the above referenced U.S. application Ser. No. 14/945,323, U.S. application Ser. No. 15/078,930, and U.S. Pat. No. 8,987,792 B2, whose disclosures are incorporated herein by reference in their entirety FIG. 3 shows a simplified schematic representation of a prior art RF power amplifier whose output power is controlled by an LDO regulator (115, 120) coupled to a drain of an output transistor (T24) of the RF power amplifier. The RF power amplifier depicted in FIG. 3 is a stacked amplifier comprising an input transistor (T21) and three stacked transistors (T22, T23, T24) whose gates are biased with fixed voltages provided by a resistor tree. A person skilled in the art would recognize that FIG. 3 represents the configuration depicted in FIG. 1 with the RF PA (150) of FIG. 2 for the exemplary case of a stack height of 4 (N=4). Gate biasing voltages to the cascoded transistors (T22, T23, T24) are provided by a resistor tree (R1, R2, R3, R4) coupled to a fixed voltage source Vreg. Such fixed voltage source may be obtained via a voltage regulator to provide a supply voltage that is independent from the supply voltage Vbatt that powers the LDO regulator (115, 120). As noted above, with reference to the RF amplifier depicted in FIG. 3, output power of the RFout signal is a function of the supply voltage at the drain of the output transistor T34, controlled by the LDO regulator, and the transconductance of the input transistor T21 controlled by the biasing of the input transistor via gate voltage VG1 and the gate voltage VG2 that together define the drain to source voltage VDS of T21.

Figure 4A:
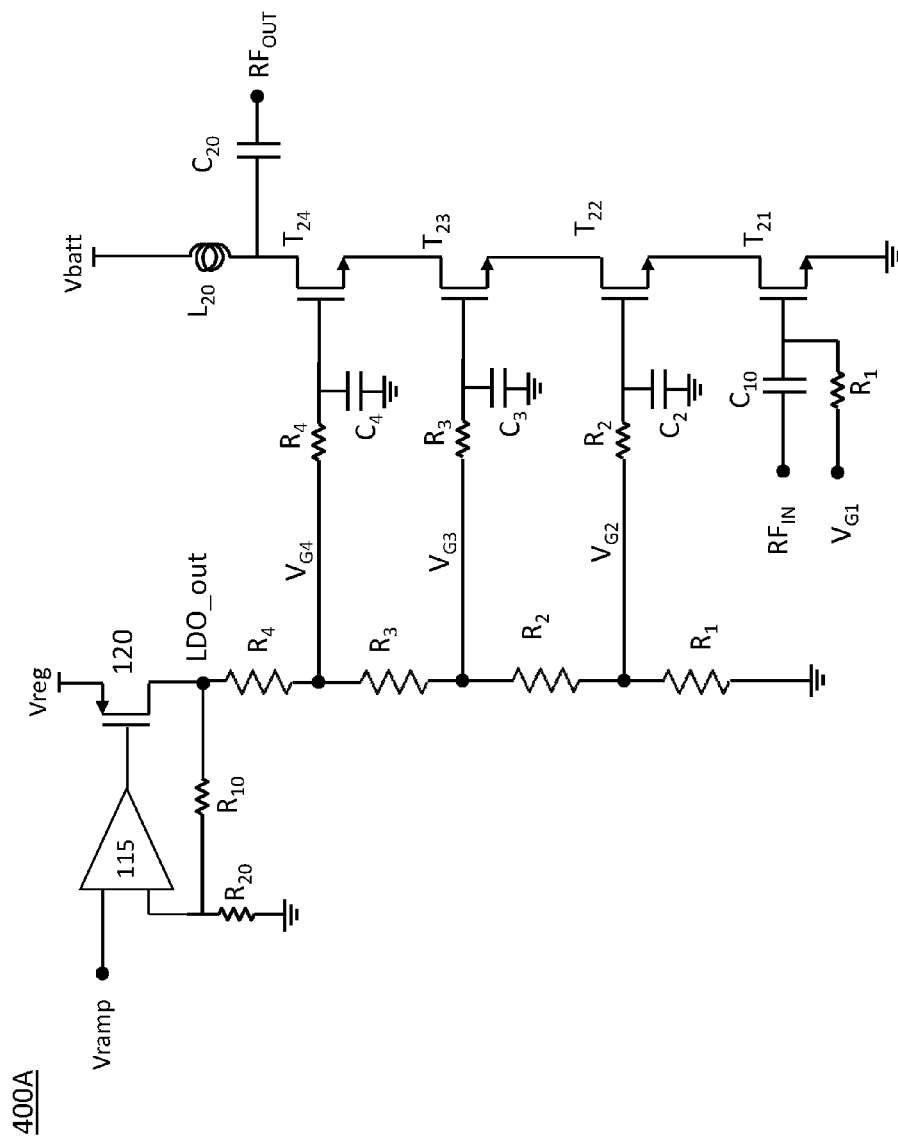
FIG. 4A is a simplified schematic representation of an RF power amplifier according to an exemplary embodiment of the present disclosure whose output power is controlled by varying voltages to gates of the cascoded transistors (T22, T23, T24) while maintaining the voltage at the drain of the output transistor (T24) (relatively) fixed by way of a supply voltage, Vbatt.

FIG. 4A is a simplified schematic representation of an RF power amplifier (400A) according to an exemplary embodiment of the present disclosure that can be used to amplify a constant envelope RFin signal (e.g. GSM signal) to obtain the RFout signal based on a constant supply voltage, Vbatt, coupled to the drain of the output transistor T34. Output power control of the RF power amplifier (400A) is provided by varying gate voltages (VG2, VG3, VG4) to the cascoded transistors (T22, T23, T24) via an LDO regulator (115, 120) whose output voltage, LDO_out, is coupled to a resistor tree (R1, R2, R3, R4). By varying the gate voltages of the cascoded transistors (T22, T23, T24) of the stack, operating bias points of the transistors (T21, T22, T23, T24) of the stack are changed to control output power of the RFout signal. Since the current through the resistor tree (R1, R2, R3, R4) can be orders of magnitude smaller than the current required through the transistor stack (e.g. 2 amps and above), the pass device (120) of the RF amplifier (400A) according to the present disclosure can be designed to be of substantially smaller size than that required in the prior art amplifier depicted in FIG. 3. As can be seen in FIG. 4, supply to the LDO regulator can be provided via a fixed voltage supply Vreg. Scaling of the LDO_out voltage with respect to the Vramp control voltage can be performed via scaling circuits similar to ones discussed above with respect to FIG. 1. Further design flexibility in scaling the gate voltages (VG2, VG3, VG4) can be provided via selection of the resistors (R1, R2, R3, R4).

With further reference to the RF amplifier (400A) according to the present disclosure, by varying the biasing points of the cascoded transistors (T22, T23, T24) through varying of the corresponding gate voltages, regions of the operation of the cascoded transistors can be made to switch from saturation to triode where the cascoded transistors operate as voltage controlled resistors thereby affecting (e.g. attenuating) the RFout signal. Also, by varying the gate voltage VG2 of T22, the drain voltage of the input transistor T21 is changed to effectively change transconductance of the input transistor T21, thereby affecting (e.g. gain/attenuation) the RFout signal. A person skilled in the art would understand that changing the drain voltage of the input transistor T21 while maintaining a fixed gate voltage, VG1, and a fixed source voltage (grounded) of the input transistor T21, changes biasing of the input transistor T21, and therefore changes its transconducatnce.

Figure 5A:
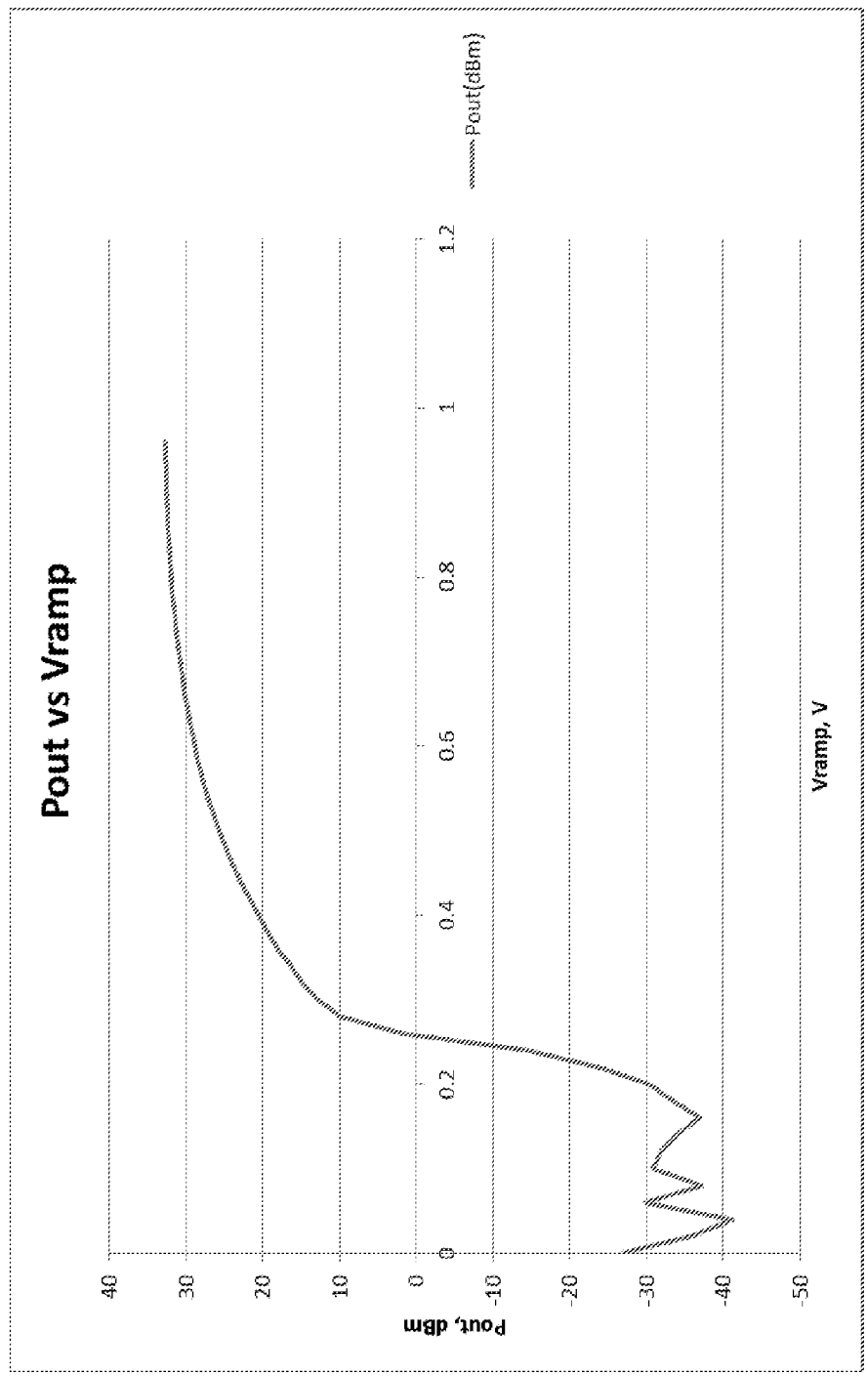
FIG. 5A is a graph representing an output power (dBm) versus an output power control voltage (Vramp) response of the RF power amplifier depicted in FIG. 4A. A dynamic range and linearity of such response is considered to be substantially equal to a response depicted in FIG. 5B of the prior art RF power amplifier of FIG. 3.
Figure 5B:
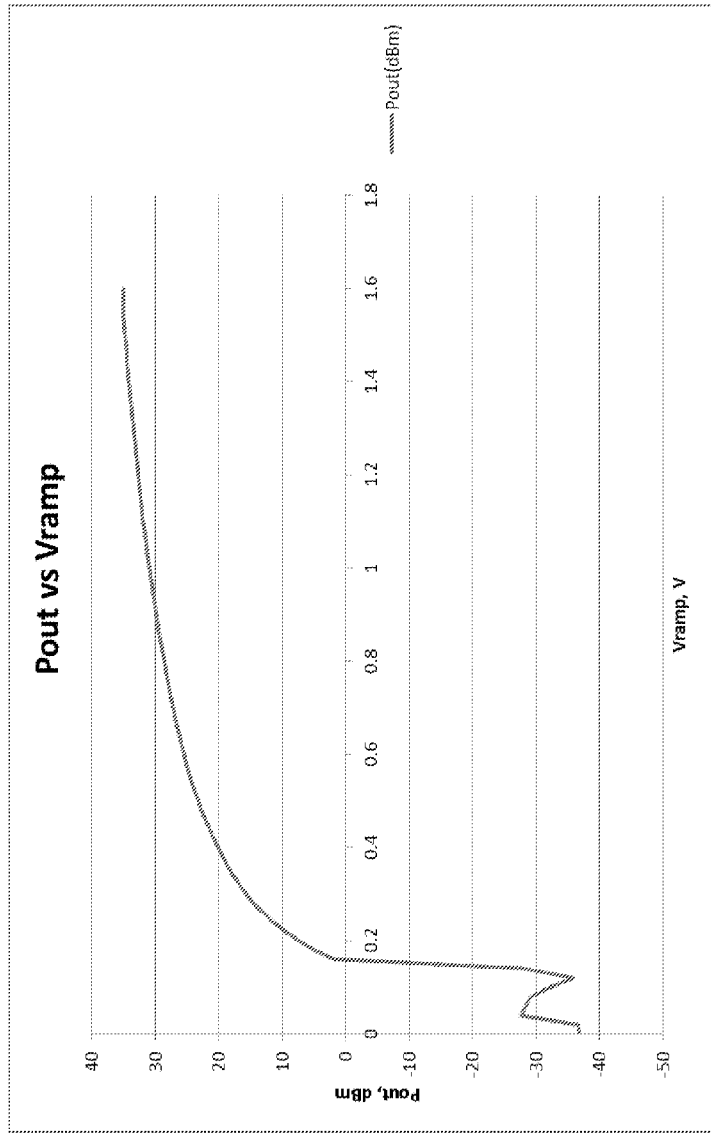
FIG. 5B is a graph representing an output power (dBm) versus an output power control voltage (Vramp) response of the prior art RF power amplifier depicted in FIG. 3.

FIGS. 5A and 5B show graphs representing respective output power (dBm) versus output power control voltage (Vramp) response of the RF power amplifier (400A) according to the present disclosure depicted in FIG. 4A and of the prior art RF power amplifier (300) depicted in FIG. 3. As can be seen in such graphs, a dynamic range, greater than 50 dBm (e.g. of about 60 dBm), and linearity of the response of the RF power amplifier (400A) is similar to a response of the prior art RF power amplifier depicted in FIG. 3, and therefore such power amplifier (400A) can be used in applications where the amplifier of FIG. 3 is used without noticeable degradation in performance, while providing the advantages of a smaller size pass device (120). Applicant of the present disclosure has also found that the linearity response may be further tweaked, if necessary, to match the linearity response of the RF power amplifier of FIG. 3 via, for example, a pre-distortion (e.g. conditioning, compensation) of the Vramp control voltage to the LDO regulator (115, 120) of the RF amplifier (400A). A person skilled in the art would know of many implementation examples to compensate for such linearity in the response.

Figure 4B:
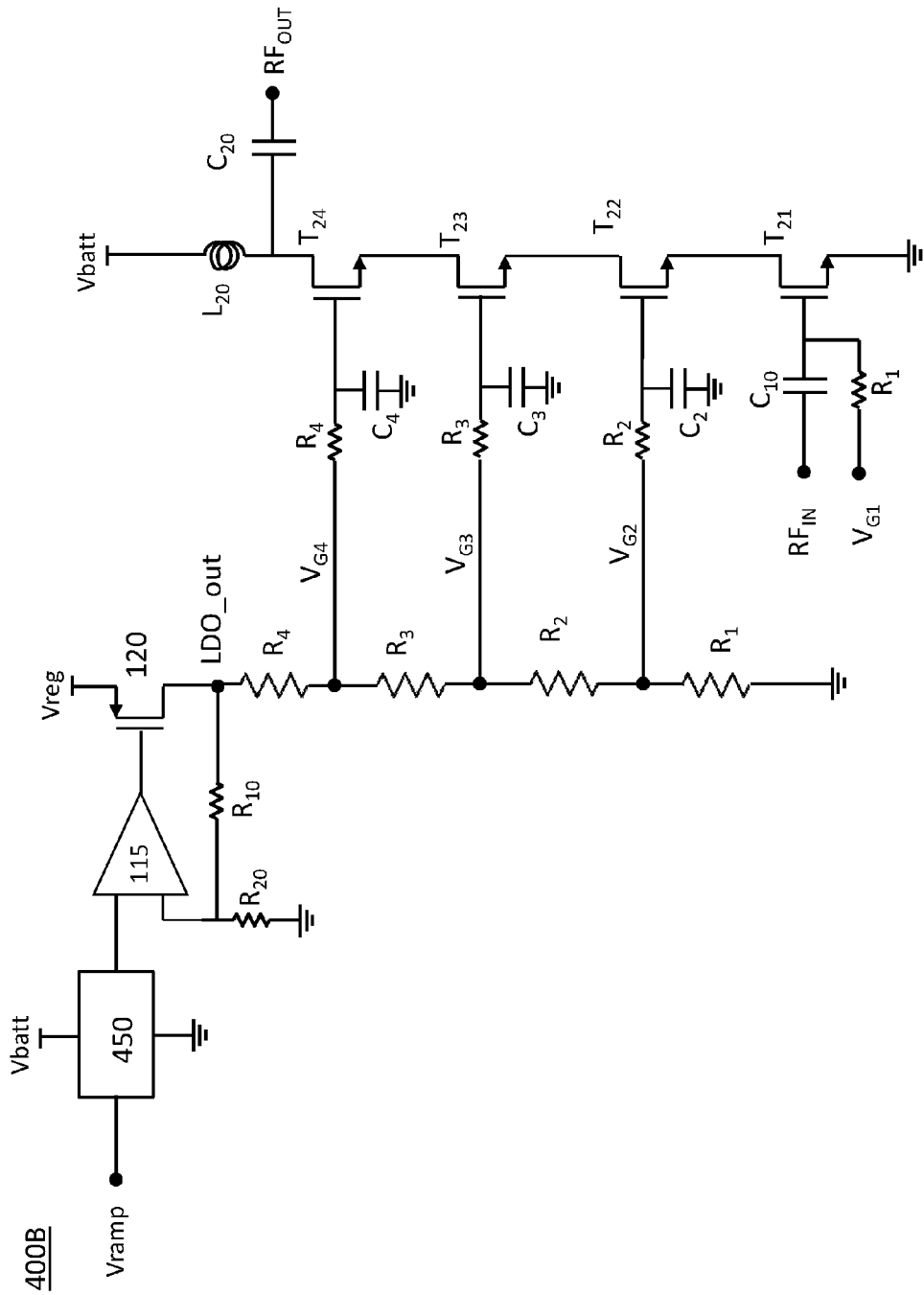
FIG. 4B is a simplified schematic representation of an RF power amplifier according to an exemplary embodiment of the present disclosure whose output power is controlled by varying voltages to gates of the cascoded transistors (T22, T23, T24) while maintaining the voltage at the drain of the output transistor (T24) (relatively) fixed by way of a supply voltage, Vbatt. A compensation circuit (450) is provided to adjust any drift in the voltage at the drain of the output transistor with respect to a varying supply voltage.

With further reference to the RF power amplifier (400A), according to the present disclosure, depicted in FIG. 4A, a person skilled in the art would understand that by virtue of not regulating power to the stacked transistors (T21, . . . , T24), in a manner similar to the configuration depicted in FIG. 3 where such regulation compensates for any variation of the supply voltage Vbatt, there may be a desire to further compensate any drift in the output power of the RF power amplifier (400A) based on the variation of the supply voltage, Vbatt. As the supply voltage, Vbatt, may be provided by a battery, such as a battery within a handheld device, a corresponding voltage level may vary within a range of, for example, 3.1 volts (fully drained) and 4.5 volts (connected to a charger). It follows that according a further embodiment of the present disclosure depicted in FIG. 4B, such drift in output power based on the variation of the supply voltage, Vbatt, may be compensated by adjustment of the Vramp voltage based on a voltage level of the supply voltage, Vbatt. As can be seen in FIG. 4B, a compensation circuit (450) coupled to the supply voltage Vbatt, and therefore aware of a level of the supply voltage, Vbatt, can adjust an effective input control voltage to the operational amplifier (115) based on the Vramp control signal and the varying voltage level of the supply voltage, Vbatt. Same compensation circuit (450) may also be used to implement a pre-distortion of the Vramp control signal for linearity response purposes as discussed above. A person skilled in the art would know of many implementation examples of the compensation circuit (450) using digital and/or analog circuits, including memory circuit that may provide desired mapping and/or functions for generation of the effective input control voltage to the operational amplifier (115) based on voltages Vramp and/or Vbatt. It should be noted that a variation of the supply voltage, Vbatt, is according to a timescale that is many orders of magnitude larger than a timescale associated with a frequency, and an envelope, of an RF signal processed by the RF amplifier, and therefore, a voltage level of the supply voltage may be considered as substantially fixed during substantial periods of amplification. In other words, the compensation circuit may not need to be a "dynamic compensation" as described, for example, in the above referenced Published US Applications No. 2014/0184336 A1, 2014/0184335 A1, and 2014/0184337 A1, the disclosures of which are incorporated herein by reference in their entirety.

Figure 6:
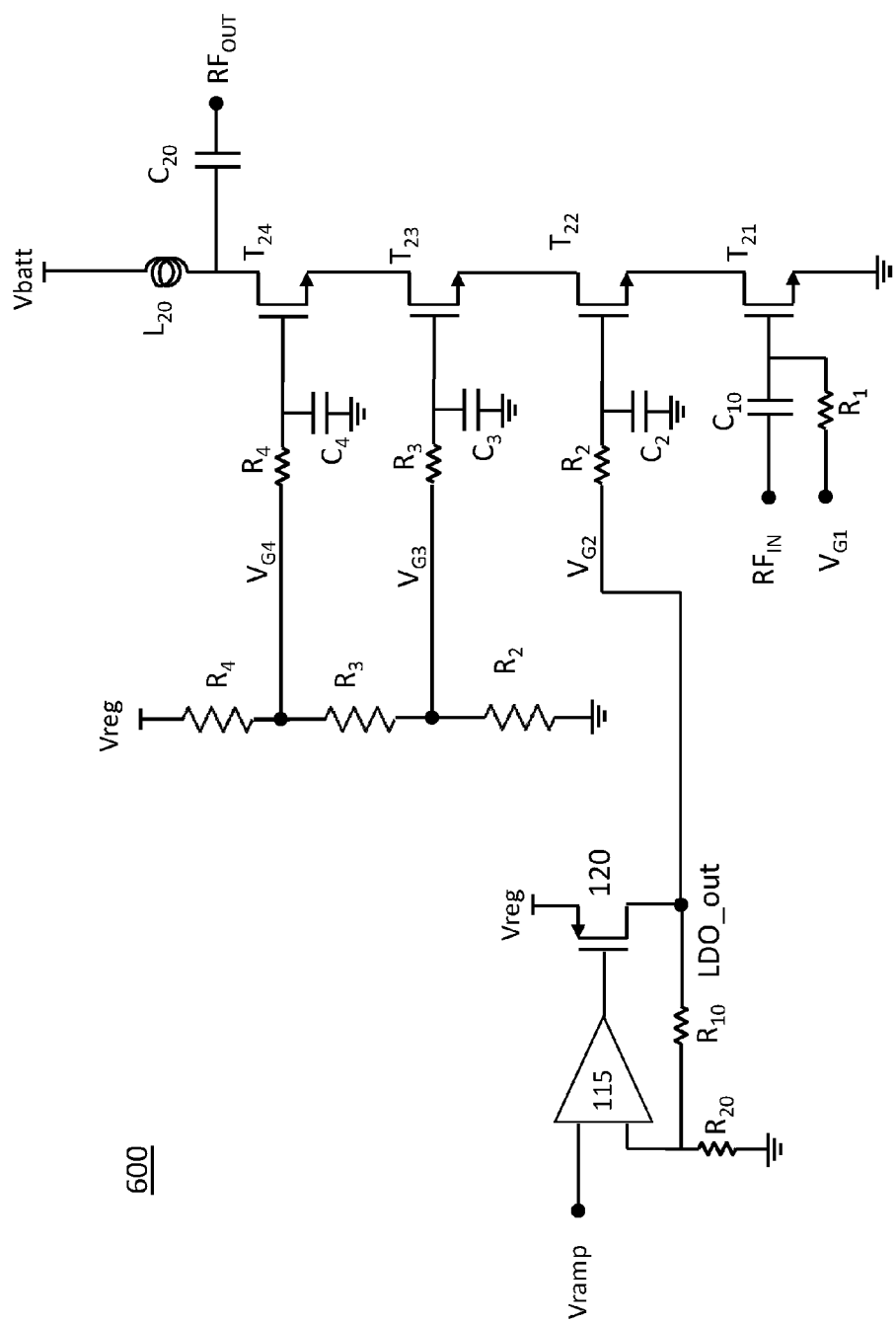
FIG. 6 is a simplified schematic representation of an RF power amplifier according to an exemplary embodiment of the present disclosure whose output power is controlled by varying a voltage to a gate of a single transistor (e.g. T22) of the cascoded transistors (T22, T23, T24) while maintaining the voltage at the drain of the output transistor (T24) (relatively) fixed and maintaining the gate voltages to the remaining cascoded transistors (T23, T24) fixed.

FIG. 6 is a simplified schematic representation of an RF power amplifier (600) according to an exemplary embodiment of the present disclosure whose output power is controlled by varying a voltage (e.g. VG2) to a gate of a single transistor (e.g. T22) of the cascoded transistors (T22, T23, T24) while maintaining the voltage at the drain of the output transistor T24 fixed and maintaining the gate voltages (VG3, VG4) to the remaining cascoded transistors (T23, T24) fixed. The RF power amplifier (600) according to the present disclosure may be considered a special case of the configuration (400A) of FIG. 4A, where instead of varying gate voltages to all the cascoded device (T22, T23, T24) only the gate voltage VG2 to the cascoded transistor (T22), in series connection to the input transistor T21, is varied. Accordingly, and as described above with reference to the RF amplifier (400A) of FIG. 4A, transconductance of the input transistor is varied so as to affect power of the RFout signal based on the Vramp control voltage to the regulator (115, 120). It should be noted that although a same supply voltage Vreg is shown in FIG. 6 to provide power to the LDO regulator and the resistor tree (R2, R3, R4), different fixed supplies may also be used.

Figure 7:
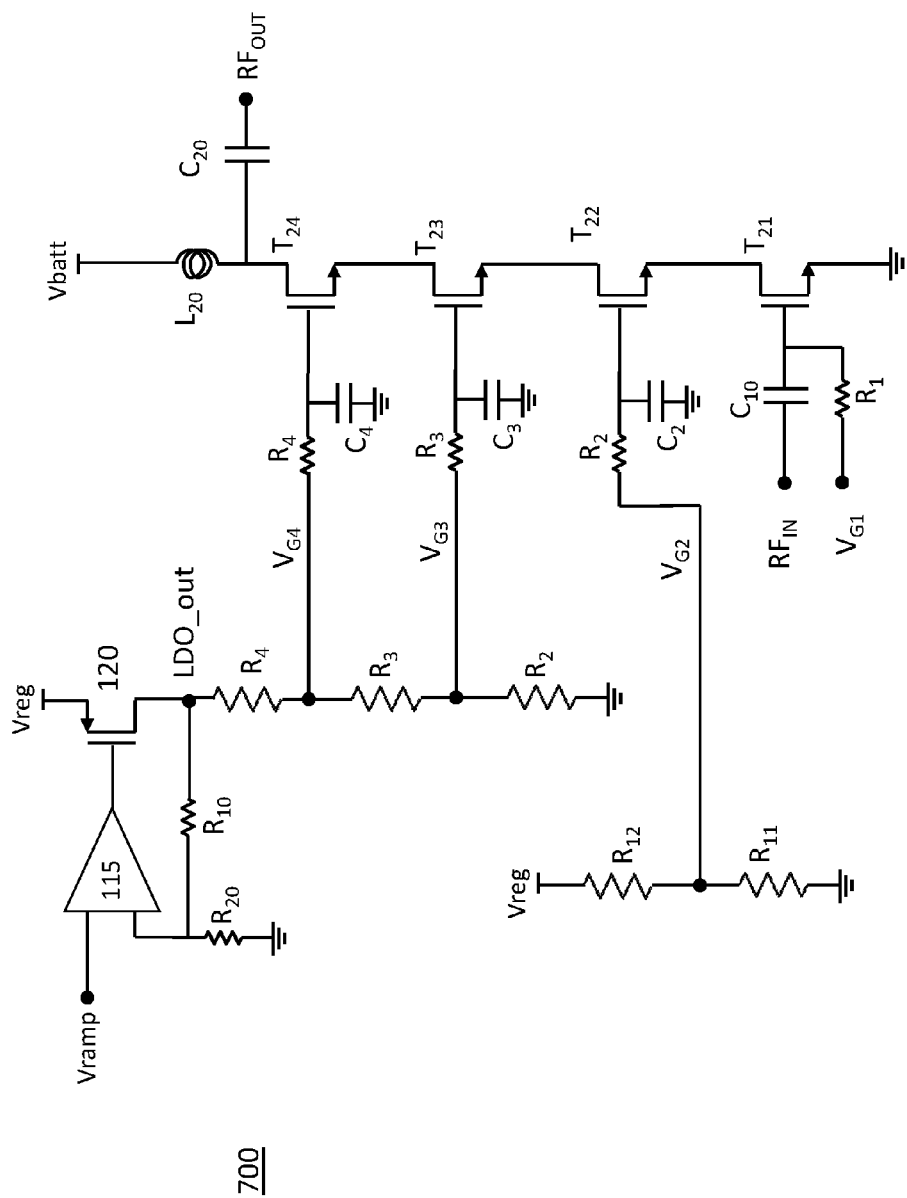
FIG. 7 is a simplified schematic representation of an RF power amplifier according to an exemplary embodiment of the present disclosure whose output power is controlled by varying a voltage to gates of a plurality of transistors (e.g. T23, T24) of the cascoded transistors (T22, T23, T24) while maintaining the voltage at the drain of the output transistor (T24) (relatively) fixed and maintaining the gate voltages to the remaining cascoded transistors (T22) fixed.

FIG. 7 depicts yet another exemplary implementation of the RF amplifier (400A) according to the present disclosure, where output power of an RF amplifier (700) is controlled by varying a voltage to the gates (VG3, VG4) of a plurality of transistors (e.g. T23, T24) of the cascoded transistors (T22, T23, T24) while maintaining the voltage at the drain of the output transistor T24 fixed (Vbatt) and maintaining the gate voltages (VG2) to the remaining cascoded transistors (T22) fixed. As noted above, by varying gate voltages of the upper cascoded transistors (T23, T24), operation of such transistors can be controlled to shift from saturation to the triode region and therefore cause attenuation of the RFout signal. Since VG2 is kept constant via the resistor tree (R11, R12), the operating bias point of the input transistor T21, and therefore its transconductance, is maintained substantially constant.

Figure 8:
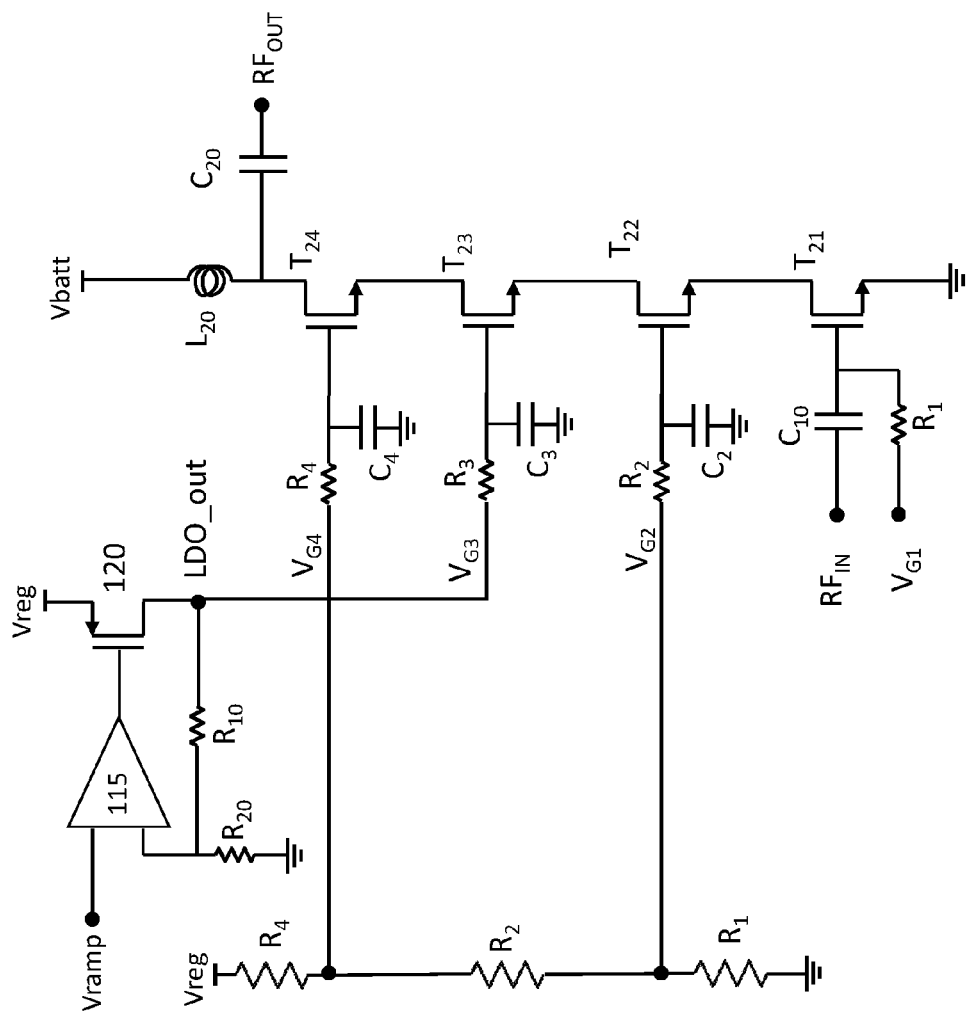
FIG. 8 is a simplified schematic representation of an RF power amplifier according to an exemplary embodiment of the present disclosure whose output power is controlled by varying a voltage to a gate of a transistor (e.g. T23) of the cascoded transistors (T22, T23, T24) while maintaining the voltage at the drain of the output transistor (T24) (relatively) fixed, by way of a supply voltage Vbatt, and maintaining the gate voltages to the remaining cascoded transistors (T22, T24) fixed. A person skilled in the art would understand that the various embodiments according to the present disclosure allow varying one or more gate voltages of the cascoded transistors (T22, T23, T24) to control output power of the amplifier while maintaining the gate voltages to the remaining cascoded transistors fixed, as well as maintaining the voltage at the drain of the output transistor to a relatively fixed level as provided by, for example, a battery of a handheld device.

FIG. 8 is a simplified schematic representation of an RF power amplifier (800) according to an exemplary embodiment of the present disclosure whose output power is controlled by varying a voltage VG3 to a gate of a transistor (e.g. T23) of the cascoded transistors (T22, T23, T24) while maintaining the voltage at the drain of the output transistor T24 fixed and maintaining the gate voltages (VG2, VG4) to the remaining cascoded transistors (T22, T24) fixed. As described above with respect to the configurations (400A, 600, 700), varying the gate voltage VG4 of the output transistor T24 can cause an attenuation of the RFout signal under control of the LDO_out voltage, while varying the gate voltage VG2 of the cascoded transistor T22 coupled to the input transistor T21 can cause change in the transconductance of the input transistor T21 for a corresponding change in the gain of the transistor stack (T21, T22, T23, T24). The configuration (800) of FIG. 8 may therefore provide, for example, for a same scaled LDO_out voltage range, a lager dynamic control of the output RF power when compared to the configuration (700), and a larger attenuation of the RF output power when compared to the configuration (600) of FIG. 6. Based on the teachings of the present disclosure, a person skilled in the art would know how to optimize a power control of an RF power amplifier in view of specific design goals than may include a required dynamic range of the power control.

The various embodiments according to the present disclosure allow varying one or more gate voltages of the cascoded transistors (T22, T23, T24) to control output power of the amplifier while maintaining the gate voltages to the remaining cascoded transistors fixed, as well as maintaining the voltage at the drain of the output transistor T24 to a relatively fixed level as provided by, for example, a battery of a handheld device. Although concept of such power control has been described by way of an LDO regulator whose input control voltage, Vramp, is scaled according to a power control design goal, to provide an LDO_out voltage used to generate corresponding gate voltages to the cascoded transistors of the stack, other implementations for generating such gate voltages may be provided, as shown in FIG. 9 and FIG. 10.

Figure 9:
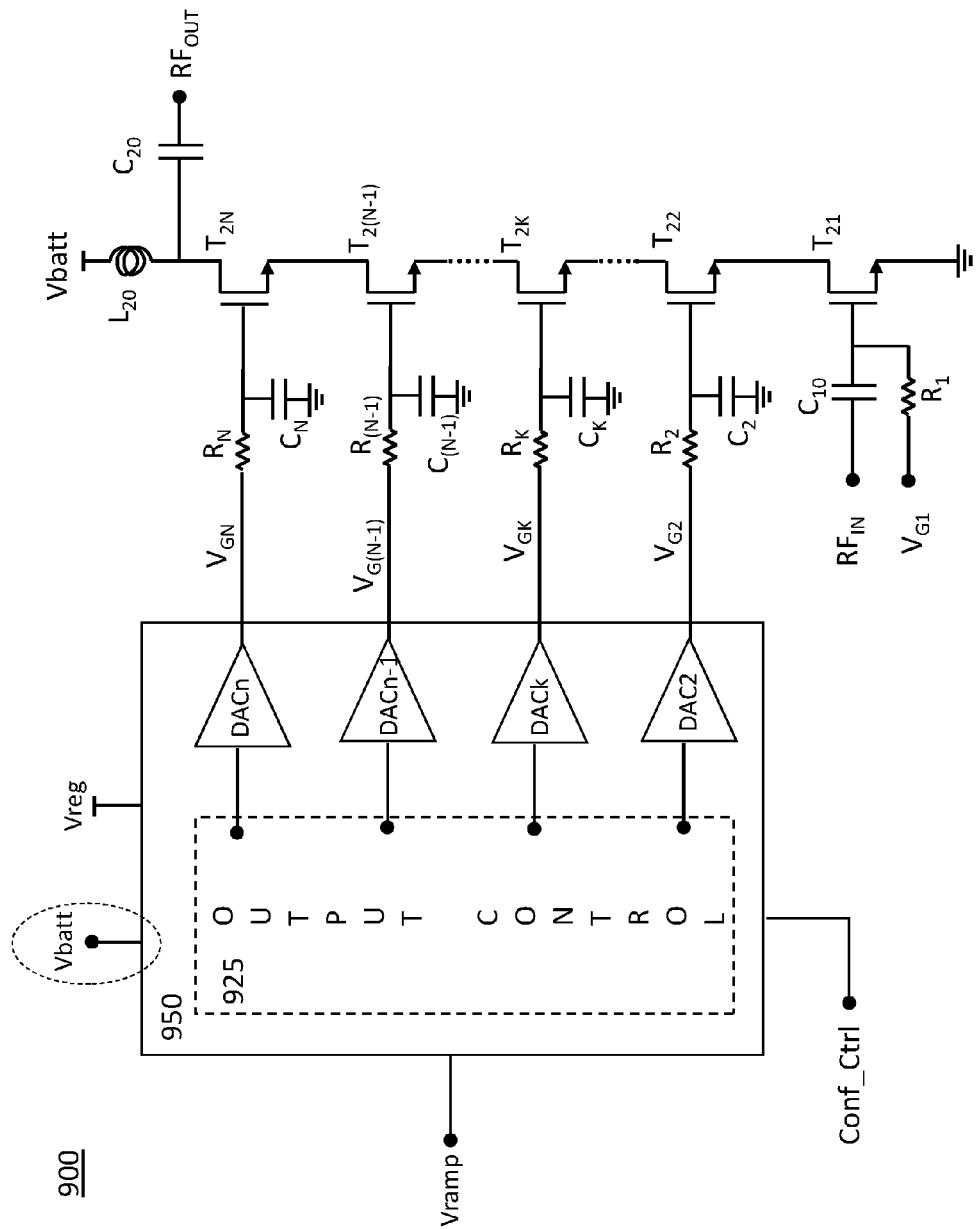
FIG. 9 is a simplified schematic representation of an RF power amplifier according to an exemplary embodiment of the present disclosure whose output power is controlled by varying one or more gate voltages of the cascoded transistors (T22, T23, . . . , T2N) while maintaining the voltage at the drain of the output transistor (T2N) (relatively) fixed and maintaining the gate voltages to the remaining cascoded transistors fixed. Varying or fixing the gate voltages may be performed by a multichannel (DAC1, DAC2, . . . , DACn) digital-to-analog converter (950) or by any other voltage control means known to a person skilled in the art.
Figure 10:
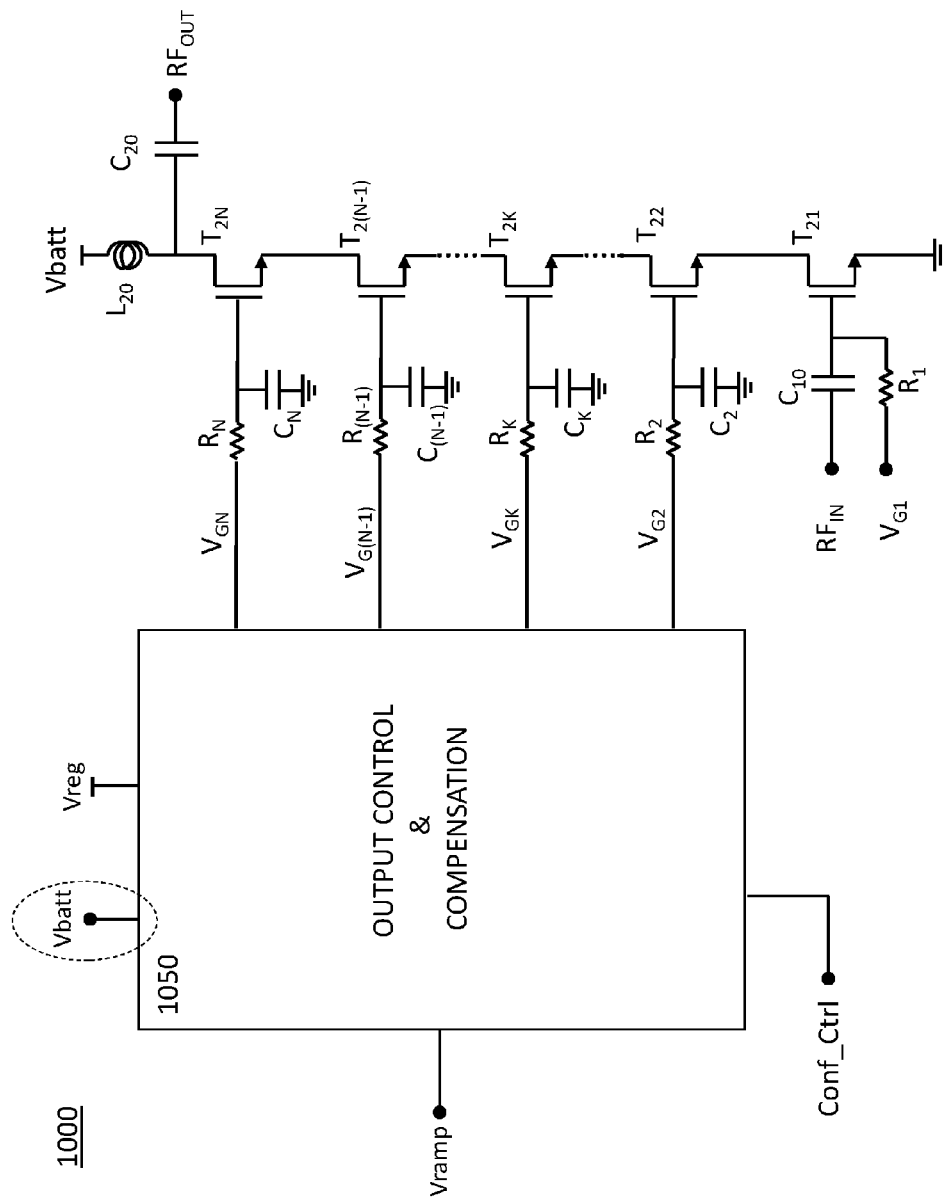
FIG. 10 is a simplified schematic representation of an RF power amplifier according to an exemplary embodiment of the present disclosure whose output power is controlled by varying one or more gate voltages of the cascoded transistors (T22, T23, . . . , T2N) while maintaining the voltage at the drain of the output transistor (T2N) (relatively) fixed and maintaining the gate voltages to the remaining cascoded transistors fixed. Varying or fixing the gate voltages may be performed by an output control & compensation module comprising analog and/or digital circuits.

FIG. 9 is a simplified schematic representation of an RF power amplifier (900) according to an exemplary embodiment of the present disclosure whose output power is controlled by varying one or more of the gate voltages (VG2, VG3, . . . , VGN) of the cascoded transistors (T22, T23, . . . , T2N) while maintaining the voltage at the drain of the output transistor (T2N) fixed and maintaining the gate voltages to remaining cascoded transistors fixed. Varying or fixing the gate voltages (VG2, VG3, . . . , VGN) may be performed by a multichannel (DAC1, DAC2, . . . , DACn) digital-to-analog converter (950) or by any other voltage control means known to a person skilled in the art. Performance of the RF amplifier (900), as measured, for example by a dynamic range and linearity response curve similar to one depicted in FIGS. 5A and 5B, may be controlled via a configuration control signal, Conf_Ctrl, provided to an output control module (925) of the DAC (950). Accordingly, any compensation for linearity and/or fixing/varying of the various gate voltages (VG2, VG3, . . . , VGN) for obtaining a desired gain/attenuation performance of the RF amplifier (900) can be controlled via the configuration control signal provided to the output control module (925). A person skilled in the art would know of many implementations of a compensation circuit that may include analog, digital or combination of analog and digital circuits. Furthermore, if desired, the supply voltage Vbatt may optionally be provided to the output control module (925) for provision of functionality equivalent to the one provided by the compensation circuit (450) discussed above with reference to FIG. 4B.

With further reference to FIG. 9, according to one exemplary embodiment of the present disclosure, a lookup table (e.g. storing configuration control data) may reside within the output control module (925) that maps the Conf_Ctrl signal to a desired performance of the RF amplifier (900) amongst one or more performance profiles stored in the lookup table. According to another exemplary embodiment of the present disclosure, the output control module (925) may include storage means that can be updated on the fly to dynamically control performance of the RF amplifier (900).

As described above, voltage to the gates of the cascoded transistors may be provided by way of analog circuits, such as described with reference to FIGS. 4A, 4B, 6-9, or by way of digital/analog circuits, such as described with reference to FIG. 9. A person skilled in the art would be able to use the present teaching to derive a variety of analog and/or circuits that can be used to control the output power provided at the drain of the output transistor T2N by varying one or more of the gate voltages (VG2, . . . , VGN) while maintaining the remaining gate voltages (VG2, . . . , VGN) fixed, as shown in FIG. 10. The output control & compensation module (1050) of FIG. 10 can provide similar functionality as provided by the module (950) of FIG. 9 and the gate biasing circuits provided in FIGS. 4A, 4B, 6-9. Optional compensation function (e.g. with respect to variation of the supply voltage Vbatt) may also be provided by the output control & compensation module (1050) of FIG. 10.

Figure 11:
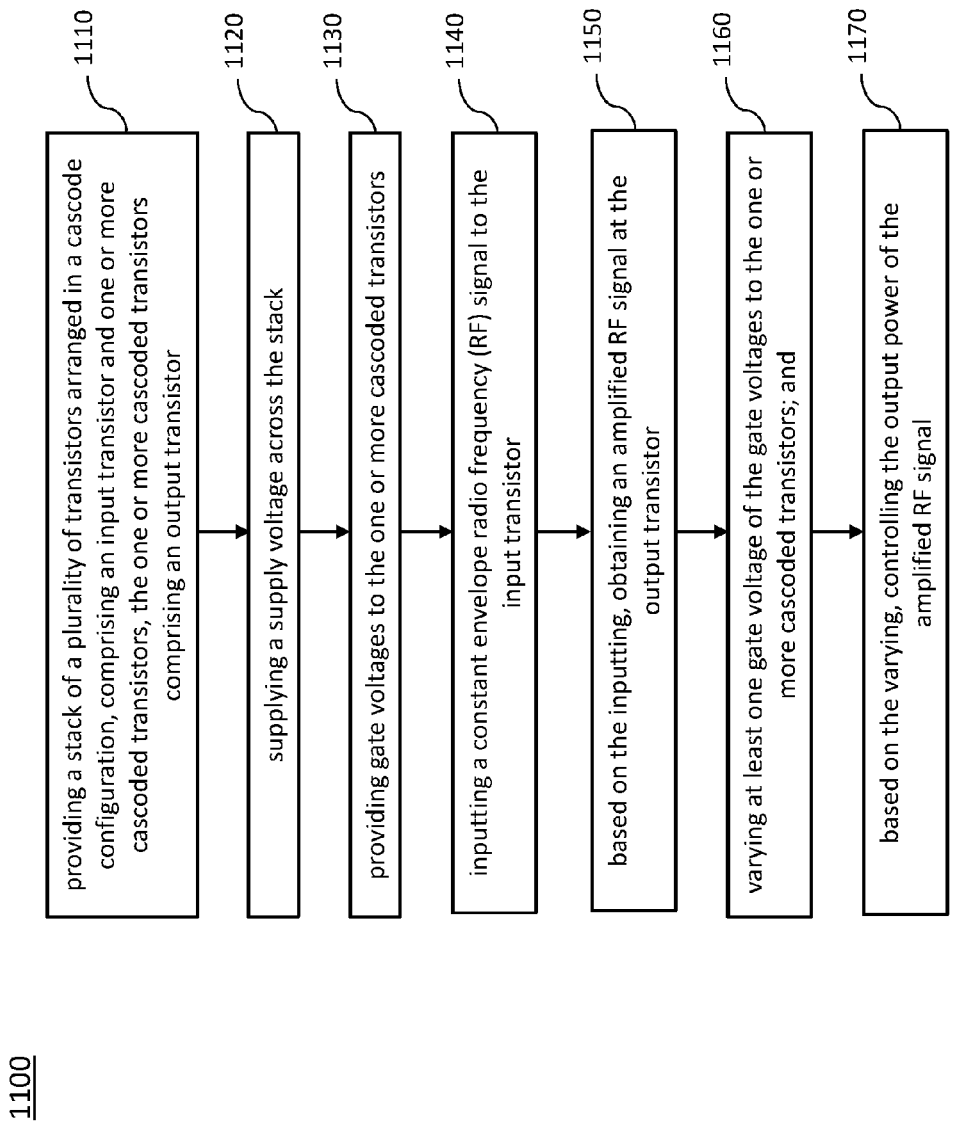
FIG. 11 is a process chart showing a method for controlling an output power of an amplifier arrangement.

FIG. 11 is a process chart (1100) showing various steps of a method for controlling an output power of an amplifier arrangement. As can be seen in the process chart (1100), the method comprises: providing a stack of a plurality of transistors arranged in a cascode configuration, comprising an input transistor and one or more cascoded transistors, the one or more cascoded transistors comprising an output transistor, per step (1110); supplying a supply voltage across the stack, per step (1120); providing gate voltages to the one or more cascoded transistors, per step (1130); inputting a constant envelope radio frequency (RF) signal to the input transistor, per step (1140); based on the inputting, obtaining an amplified RF signal at the output transistor, per step (1150); varying at least one gate voltage of the gate voltages to the one or more cascoded transistors, per step (1160); and based on the varying, controlling the output power of the amplified RF signal, per step (1170).

A person skilled in the art may apply the present teachings to variety of different amplifier designs that use the same basic concept of varying one or more gate voltages of the cascoded transistors (T22, T23, . . . , T2N) in order to control output power of an amplifier that operates from a fixed drain voltage (e.g. Vbatt) at the output transistor (T2N) to amplify a constant amplitude RFin signal. Such teachings allow design of such amplifiers with a reduced size pass device (120), as shown in FIGS. 4A, 4B, 6, 7 and 8, or alternatively, without the need of any pass device, as shown in FIG. 9. In one exemplary case, the present teachings have allowed a reduction of 20% in die size of an RF power amplifier (GSM) when compared to a traditional design approach (e.g. per FIGS. 1-3) while maintaining a same performance characteristic (linearity, dynamic range) of the RF amplifier. Increased PAE for a given range of the Vramp power control voltage can be attributed to the removal of the large size pass device (120) from the main current conduction path of the stacked transistors (T21, T22, . . . , T2N), where a high current (e.g. 2 amps and over) through the pass device (120) of the traditional design approach may cause a power loss in the pass device (120). The person skilled in the art may also apply the present teachings to a variety of power management applications where pass devices are used in a main conduction path of stacked transistors of a power management circuit; by removing the (large size) pass devices from the main conduction path and controlling an output power via gate bias voltages to one or more casocded devices of the stacked transistors, a substantial reduction in size of the overall power management circuit may be obtained.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET"

as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the invention, which is defined by the scope of the following claims, and that other embodiments are within the scope of the claims.

The invention claimed is:

1. A circuital arrangement comprising:
a stack of a plurality of transistors arranged in a cascode configuration, comprising:
(i) an input transistor adapted to receive an input radio frequency (RF) signal; and
(ii) one or more cascoded transistors, the one or more cascoded transistors comprising an output transistor adapted to output, at an adjustable output power, an output RF signal based on the input RF signal;
a first resistor tree comprising a plurality of series connected resistors; and
a low dropout (LDO) regulator coupled to the first resistor tree,
wherein:
the adjustable output power is controlled by varying at least one gate voltage of the one or more cascoded transistors of the stack,
a node of the first resistor tree is configured to provide the at least one gate voltage, and
a control voltage to the LDO regulator varies the at least one gate voltage to provide the adjustable output power from the stack.

2. The circuital arrangement according to claim 1, further comprising one or more gate capacitors each connected between a gate of a transistor of the one or more cascoded transistors and a reference potential, wherein the each gate capacitor is configured to allow a gate voltage at the gate to vary along with an RF voltage at a drain of the transistor.

3. The circuital arrangement according to claim 2, wherein the one or more gate capacitors are configured to substantially equalize an RF voltage of the output RF signal at a drain of the output transistor across the plurality of transistors of the stack.

4. The circuital arrangement according to claim 2, wherein:
the input RF signal is a constant envelope input RF signal, and
the circuital arrangement is adapted to amplify the constant envelope input RF signal and generate the output RF signal as an amplified version of the input RF signal at a drain terminal of the output transistor according to the adjustable output power.

5. The circuital arrangement according to claim 1, wherein the at least one gate voltage comprises two or more gate voltages of the one or more cascoded transistors.

6. The circuital arrangement according to claim 1, wherein the at least one gate voltage comprises a gate voltage of the output transistor.

7. The circuital arrangement according to claim 1, wherein the at least one gate voltage comprises a gate voltage of a transistor of the one or more cascoded transistors that is directly coupled to the input transistor.

8. The circuital arrangement according to claim 1, further comprising:
a second resistor tree comprising a plurality of series connected resistors,
wherein:
the second resistor tree is configured to provide fixed voltages to remaining gate voltages of the one or more transistors of the cascoded transistors of the stack based on a fixed regulated voltage.

9. A circuital arrangement comprising:
a stack of a plurality of transistors arranged in a cascode configuration, comprising:
(i) an input transistor adapted to receive an input radio frequency (RF) signal; and
(ii) one or more cascoded transistors, the one or more cascoded transistors comprising an output transistor adapted to output, at an adjustable output power, an output RF signal based on the input RF signal; and
a gate voltage control module coupled to gates of the one or more transistors of the stack,
wherein:
the adjustable output power is controlled by varying at least one gate voltage of the one or more cascoded transistors of the stack, and
the gate voltage control module is configured to provide, based on a control voltage, the at least one gate voltage independently from remaining gate voltages of the one or more transistors of the cascoded transistors of the stack.

10. The circuital arrangement according to claim 9, wherein the gate voltage control module is further configured to provide fixed voltages to remaining gate voltages of the one or more transistors of the cascoded transistors of the stack.

11. The circuital arrangement according to claim 10, wherein the gate voltage control module further comprises a configuration control module configured to control association of the at least one gate voltage and the fixed voltages to the gates of the one or more transistors of the stack based on configuration control data.

12. The circuital arrangement according to claim 11, wherein the configuration control module comprises a lookup table adapted to store the configuration control data.

13. The circuital arrangement according to claim 12, wherein the configuration control data are in correspondence of one or more performance profiles of the circuital arrangement.

14. The circuital arrangement according to claim 12, wherein the one or more performance profiles comprises: a) a linearity performance, and b) a dynamic range performance.

15. The circuital arrangement according to claim 1, wherein the plurality of transistors are metal-oxide-semiconductor (MOS) field effect transistors (FETs), or complementary metal-oxide-semiconductor (CMOS) field effect transistors (FETs).

16. The circuital arrangement according to claim 15, wherein the plurality of transistors are fabricated using one of: a) silicon-on-insulator (SOI) technology, and b) silicon-on-sapphire technology (SOS).

17. The circuital arrangement according to claim 1, wherein the circuital arrangement is adapted to operate as an RF power amplifier for a GSM system.

18. The circuital arrangement according to claim 1, wherein a supply voltage to the stack is a substantially fixed supply voltage.

19. The circuital arrangement according to claim 18, wherein the substantially fixed supply voltage is a battery voltage.

20. The circuital arrangement according to claim 1, wherein a dynamic range of the adjustable output power is larger than 50 dB.

21. The circuital arrangement according to claim 20, wherein the dynamic range of the adjustable output power is larger than about 60 dB.

22. The circuital arrangement according to claim 1, wherein:
a supply voltage to the stack is a varying supply voltage, and
a drift of the adjustable output power with respect to the varying supply voltage is compensated for by further varying the at least one gate voltage according to a variable voltage level of the varying supply voltage.

23. A method for controlling an output power of an amplifier arrangement, the method comprising:
providing a stack of a plurality of transistors arranged in a cascode configuration, comprising an input transistor and one or more cascoded transistors, the one or more cascoded transistors comprising an output transistor;
providing a first resistor tree comprising a plurality of series connected resistors and a low dropout (LDO) regulator coupled to the first resistor tree;
supplying a supply voltage across the stack;
providing gate voltages to the one or more cascoded transistors;
inputting a constant envelope radio frequency (RF) signal to the input transistor;
based on the inputting, obtaining an amplified RF signal at the output transistor;
varying at least one gate voltage of the gate voltages to the one or more cascoded transistors; and
based on the varying, controlling the output power of the amplified RF signal,
wherein a node of the first resistor tree is configured to provide the at least one gate voltage, and
wherein a control voltage to the LDO regulator varies the at least one gate voltage for controlling of the output power of the amplified RF signal.

24. The method according to claim 23, further comprising:
based on the varying, varying a transconductance of the stack.

25. The method according to claim 23, further comprising:
based on the varying, varying an ON resistance of a transistor of the one or more cascoded transistors.

26. The method according to claim 23, further comprising:
based on the varying, changing a region of operation of a transistor of the one or more cascoded transistors from a saturation region of operation to a triode region of operation, or vice versa.

27. The method according to claim 23, further comprising:
coupling gate capacitors to gates of the one or more cascoded transistors; and
based on the coupling, providing a substantial equal division of the amplified RF signal across the plurality of the transistors of the stack.

28. The method according to claim 23, further comprising:
based on the varying, limiting a voltage across any two terminals of the input transistor and
based on the limiting, reducing a hot carrier injection (HCI) effect of the input transistor.

29. The method according to claim 23, wherein the supply voltage is a varying supply voltage, the method further comprising:
determining a voltage level of the supply voltage;
based on the determining, further varying the at least one gate voltage; and
based on the further varying, maintaining the output power of the amplified RF signal.

30. The method according to claim 23, wherein the controlling of the output power of the amplified RF signal provides a dynamic range of the output power greater than 50 dB.

* * * * *